(12) United States Patent
Greenlee et al.

(10) Patent No.: US 12,114,492 B2
(45) Date of Patent: Oct. 8, 2024

(54) MEMORIES HAVING VERTICALLY STACKED CONDUCTIVE FILLED STRUCTURES

(71) Applicant: Micron Technology, Inc., Boise, ID (US)

(72) Inventors: Jordan D. Greenlee, Boise, ID (US); John Mark Meldrim, Boise, ID (US); Everett A. McTeer, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 807 days.

(21) Appl. No.: 17/071,980

(22) Filed: Oct. 15, 2020

(65) Prior Publication Data

US 2021/0066332 A1 Mar. 4, 2021

Related U.S. Application Data

(60) Continuation of application No. 16/736,089, filed on Jan. 7, 2020, now Pat. No. 10,840,255, which is a
(Continued)

(51) Int. Cl.
| | |
|---|---|
| *H10B 43/27* | (2023.01) |
| *H01L 21/285* | (2006.01) |
| *H10B 41/27* | (2023.01) |
| *H10B 43/10* | (2023.01) |
| *H10B 41/10* | (2023.01) |

(52) U.S. Cl.
CPC ....... *H10B 41/27* (2023.02); *H01L 21/28562* (2013.01); *H10B 43/10* (2023.02);
(Continued)

(58) Field of Classification Search
CPC ........ H10B 41/27; H10B 43/10; H10B 43/27; H10B 41/10; H01L 21/28562; H01L 21/28518; H01L 21/28568
See application file for complete search history.

(56) References Cited

U.S. PATENT DOCUMENTS

| | | |
|---|---|---|
| 7,741,972 B2 | 6/2010 | Hashimoto et al. |
| 9,019,775 B2 | 4/2015 | Costa et al. |
| (Continued) | | |

FOREIGN PATENT DOCUMENTS

| | | |
|---|---|---|
| CN | 101142711 | 3/2008 |
| CN | 104428837 | 3/2015 |
| (Continued) | | |

*Primary Examiner* — Christopher A Johnson
(74) *Attorney, Agent, or Firm* — Wells St. John P.S.

(57) ABSTRACT

Some embodiments include a method in which an assembly is formed to have voids within a stack, and to have slits adjacent the voids. Peripheral boundaries of the voids have proximal regions near the slits and distal regions adjacent the proximal regions. A material is deposited within the voids under conditions which cause the material to form to a greater thickness along the distal regions than along the proximal regions. Some embodiments include an assembly having a stack of alternating first and second levels. The second levels include conductive material. Panel structures extend through the stack. The conductive material within the second levels has outer edges with proximal regions near the panel structures and distal regions adjacent the proximal regions. Interface material is along the outer edges of the conductive material and has a different composition along the proximal regions than along the distal regions.

31 Claims, 20 Drawing Sheets

Related U.S. Application Data division of application No. 16/443,491, filed on Jun. 17, 2019, now Pat. No. 10,559,579, which is a continuation of application No. 16/186,042, filed on Nov. 9, 2018, now Pat. No. 10,361,214, which is a division of application No. 15/848,398, filed on Dec. 20, 2017, now Pat. No. 10,170,493.

(52) U.S. Cl.
CPC ........ *H10B 43/27* (2023.02); *H01L 21/28518* (2013.01); *H01L 21/28568* (2013.01); *H10B 41/10* (2023.02)

(56) References Cited

U.S. PATENT DOCUMENTS

| | | |
|---|---|---|
| 10,361,214 B2 | 7/2019 | Greenlee |
| 2003/0155607 A1 | 8/2003 | Kamigaki et al. |
| 2007/0048940 A1 | 3/2007 | Eitan et al. |
| 2008/0018479 A1 | 1/2008 | Hashimoto |
| 2010/0320527 A1 | 12/2010 | Okamura et al. |
| 2012/0094453 A1* | 4/2012 | Han .................... H01L 29/7926 438/269 |
| 2013/0107653 A1 | 5/2013 | Kwak |
| 2014/0349477 A1* | 11/2014 | Chandrashekar ........................... H01L 21/76841 156/345.24 |
| 2015/0318299 A1 | 11/2015 | Lai |
| 2016/0365351 A1 | 12/2016 | Nishikawa |
| 2017/0025433 A1* | 1/2017 | Lee ........................ H10B 43/10 |
| 2018/0090373 A1* | 3/2018 | Sharangpani .......... H10B 41/35 |
| 2018/0219017 A1 | 8/2018 | Goda et al. |
| 2018/0350826 A1* | 12/2018 | Wrench ............. H01L 21/28556 |

FOREIGN PATENT DOCUMENTS

| | | |
|---|---|---|
| CN | 105023926 | 11/2015 |
| CN | 106158035 | 11/2016 |

\* cited by examiner

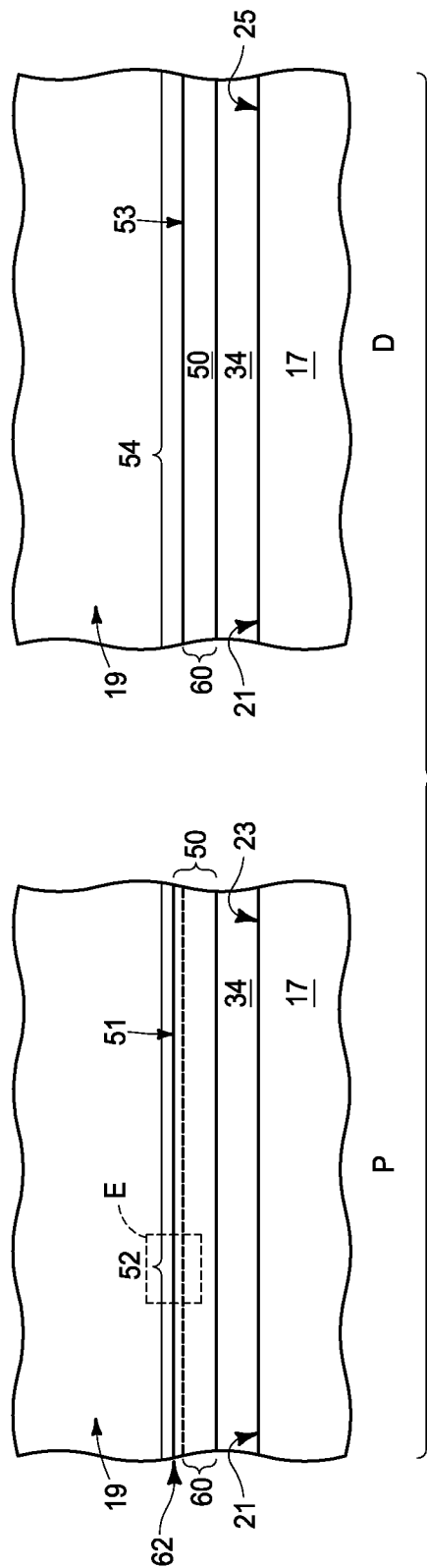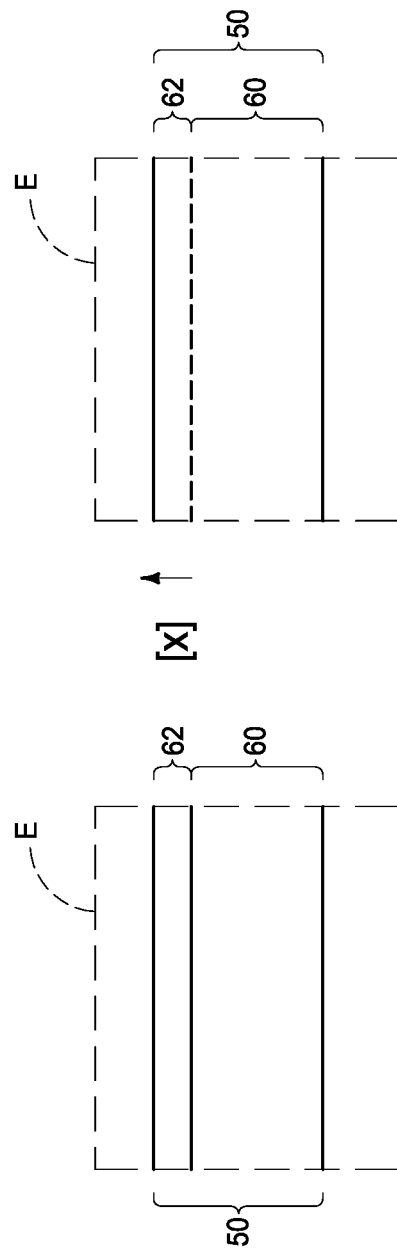

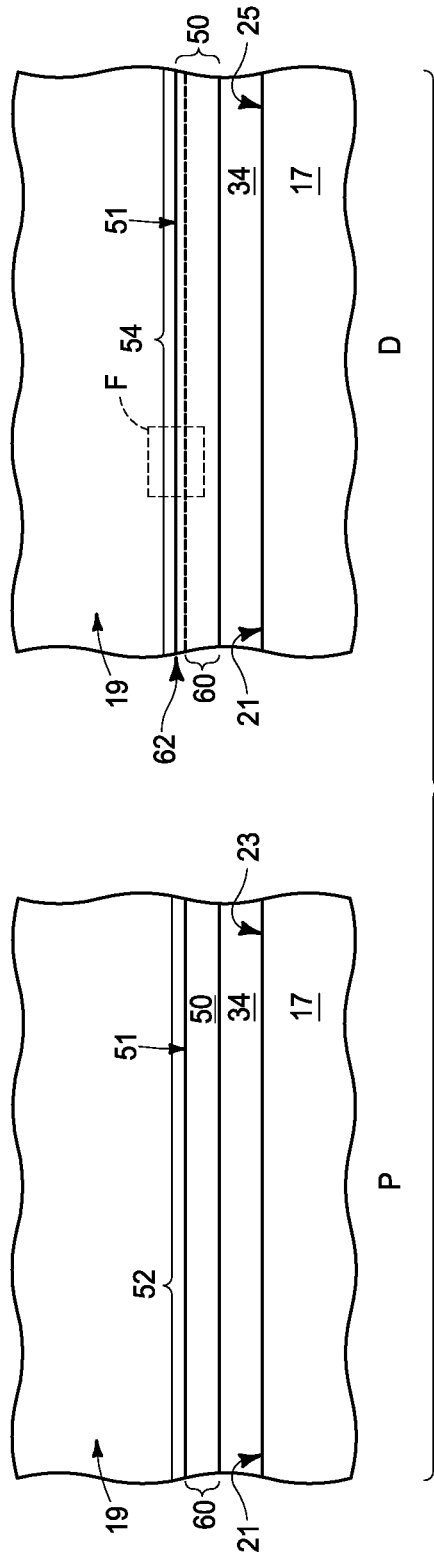
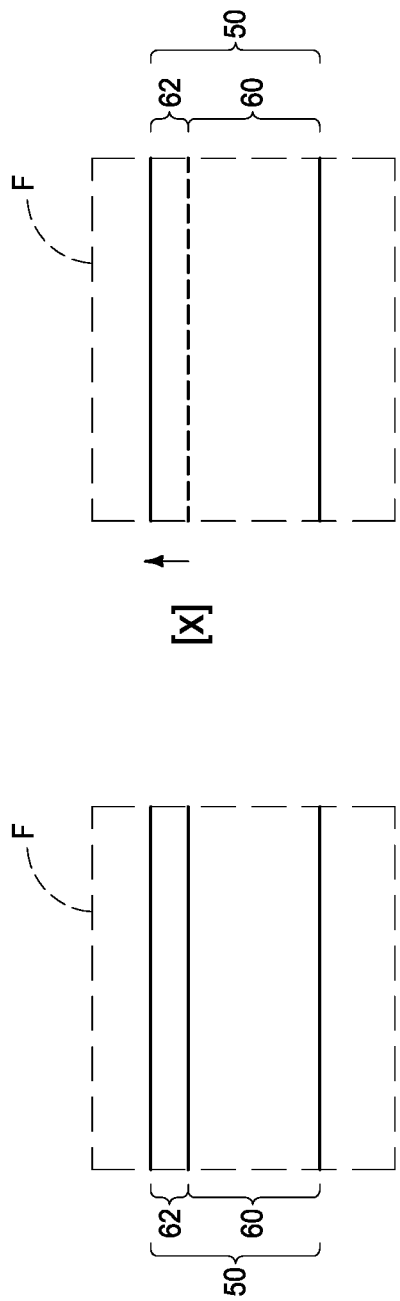

MEMORIES HAVING VERTICALLY STACKED CONDUCTIVE FILLED STRUCTURES

RELATED PATENT DATA

This patent resulted from a continuation of U.S. patent application Ser. No. 16/736,089, filed Jan. 7, 2020, now U.S. Pat. No. 10,840,255, which resulted from a division of U.S. patent application Ser. No. 16/443,491, filed Jun. 17, 2019, now U.S. Pat. No. 10,559,579, which resulted from a continuation of U.S. patent application Ser. No. 16/186,042, filed Nov. 9, 2018, now U.S. Pat. No. 10/361,214, which resulted from a division of U.S. patent application Ser. No. 15/848,398, filed Dec. 20, 2017, now U.S. Pat. No. 10,170,493, all of which disclosures are hereby incorporated herein by reference.

TECHNICAL FIELD

Methods of filling openings with conductive material, and assemblies having vertically-stacked conductive structures.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 100 which includes a memory array 102 having a plurality of memory cells 103 arranged in rows and columns along with access lines 104 (e.g., wordlines to conduct signals WL0 through WLm) and first data lines 106 (e.g., bitlines to conduct signals BL0 through BLn). Access lines 104 and first data lines 106 may be used to transfer information to and from the memory cells 103. A row decoder 107 and a column decoder 108 decode address signals A0 through AX on address lines 109 to determine which ones of the memory cells 103 are to be accessed. A sense amplifier circuit 115 operates to determine the values of information read from the memory cells 103. An I/O circuit 117 transfers values of information between the memory array 102 and input/output (I/O) lines 105. Signals DQ0 through DQN on the I/O lines 105 can represent values of information read from or to be written into the memory cells 103. Other devices can communicate with the device 100 through the I/O lines 105, the address lines 109, or the control lines 120. A memory control unit 118 controls memory operations to be performed on the memory cells 103 utilizing signals on the control lines 120. The device 100 can receive supply voltage signals Vcc and Vss on a first supply line 130 and a second supply line 132, respectively. The device 100 includes a select circuit 140 and an input/output (I/O) circuit 117. The select circuit 140 can respond, via the I/O circuit 117, to signals CSEL1 through CSELn to select signals on the first data lines 106 and the second data lines 113 that can represent the values of information to be read from or to be programmed into the memory cells 103. The column decoder 108 can selectively activate the CSEL1 through CSELn signals based on the A0 through AX address signals on the address lines 109. The select circuit 140 can select the signals on the first data lines 106 and the second data lines 113 to provide communication between the memory array 102 and the I/O circuit 117 during read and programming operations.

The memory array 102 of FIG. 1 may be a NAND memory array, and FIG. 2 shows a block diagram of a three-dimensional NAND memory device 200 which may be utilized for the memory array 102 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16MB (e.g., 16 WLs×32 tiers×2 bits=1,024 pages/block, block size=1,024 pages×16KB/page=16MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column', tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 1.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

Three-dimensional integrated structures (e.g., three-dimensional NAND) may have vertically-stacked wordline levels. It can be difficult to uniformly deposit conductive material within the wordline levels. It would be desirable to develop methods for providing conductive material within the wordline levels. It would also be desirable to develop new architectures fabricated utilizing such new methods.

BRIEF DESCRIPTION OF THE DRAWINGS

FIGS. 12-15 are diagrammatic cross-sectional views of regions labelled "P" and "D" of FIG. 11 illustrating example embodiments.

FIGS. 14A and 14B are diagrammatic cross-sectional views of a region labeled E of FIG. 14 illustrating example embodiments.

FIGS. 15A and 15B are diagrammatic cross-sectional views of a region labeled F of FIG. 15 illustrating example embodiments.

DETAILED DESCRIPTION OF THE ILLUSTRATED EMBODIMENTS

Some embodiments include new methods for depositing conductive wordline material within assemblies comprising vertically-stacked memory cells (e.g., three-dimensional NAND memory arrays). Some embodiments include new structures formed utilizing the new methods described herein. Example embodiments are described with reference to FIGS. 5, 6 and 8-18. FIG. 7 is provided to illustrate a prior art process stage for comparison relative to methods of the present invention.

Figure 1:
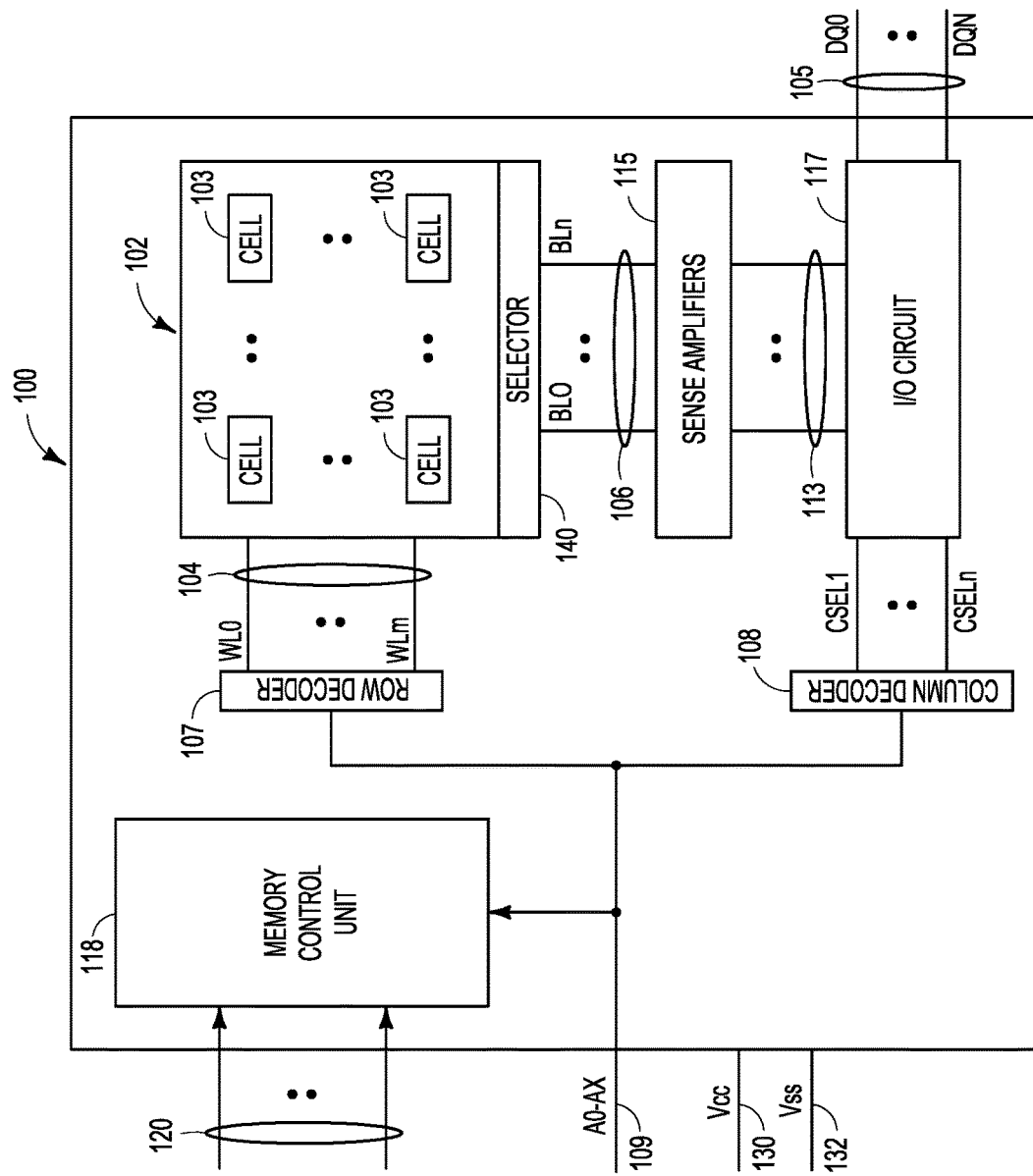
FIG. 1 shows a block diagram of a prior art memory device having a memory array with memory cells.
Figure 2:
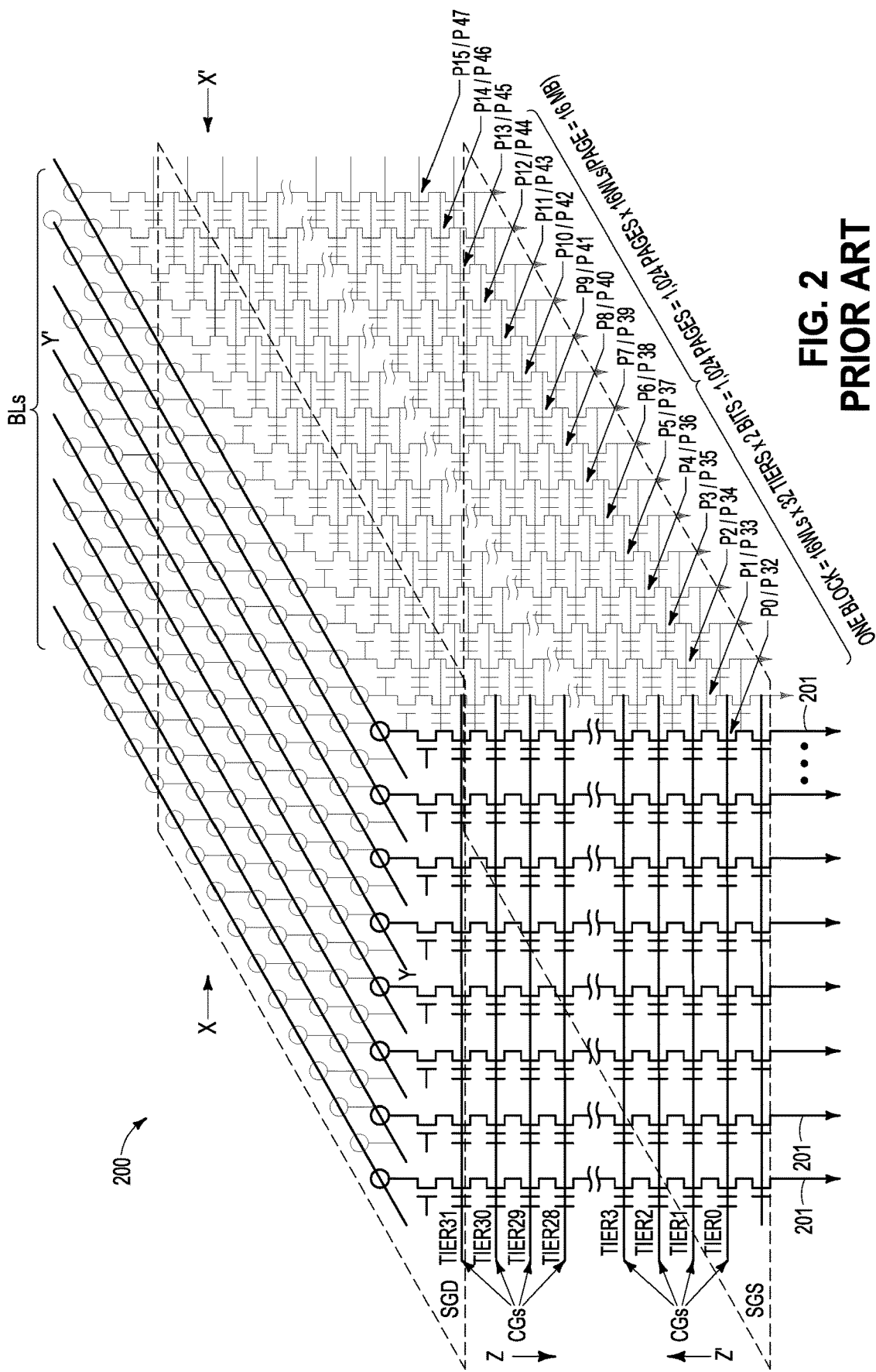
FIG. 2 shows a schematic diagram of the prior art memory array of FIG. 1 in the form of a 3D NAND memory device.
Figure 3:
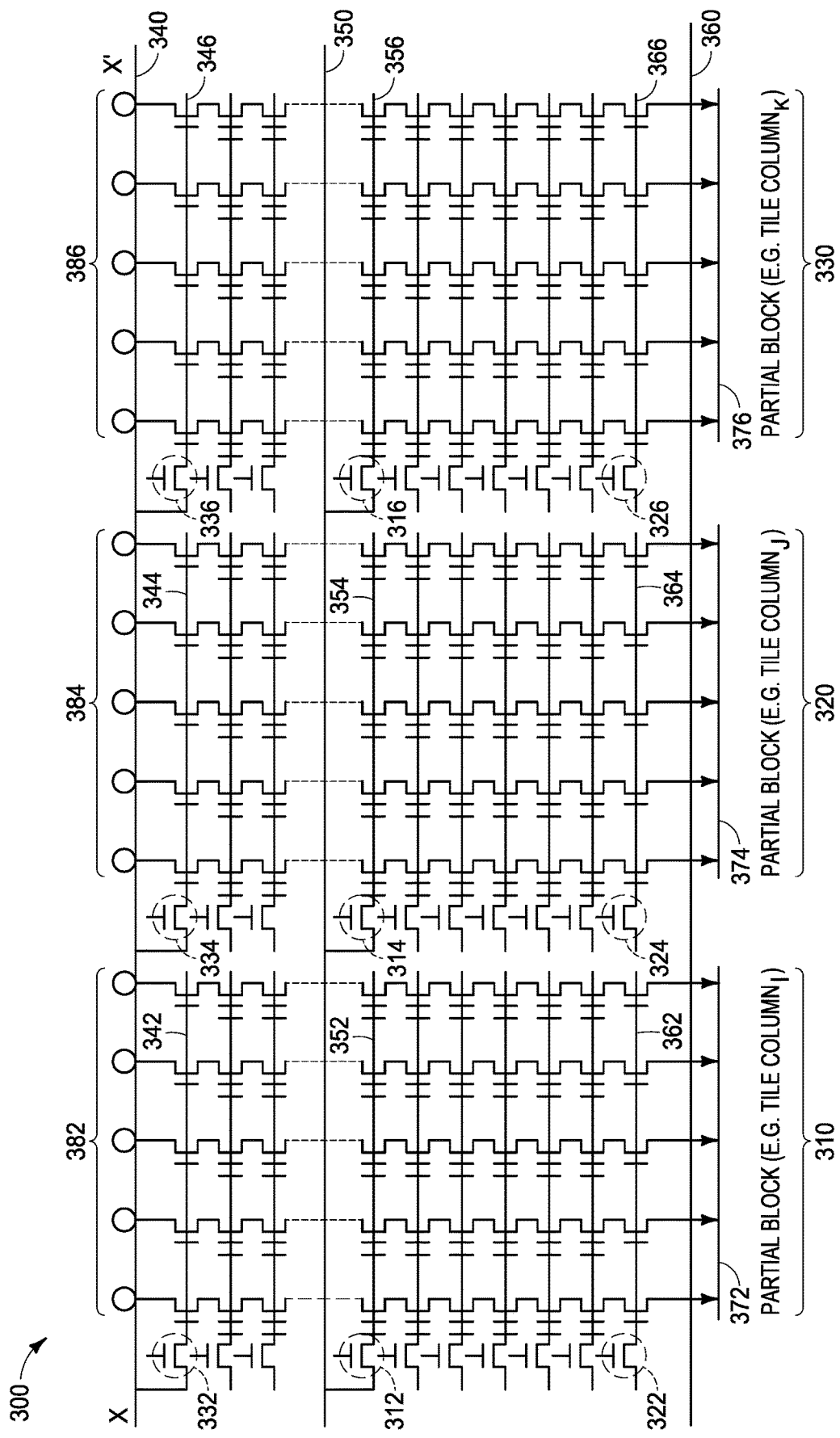
FIG. 3 shows a cross sectional view of the prior art 3D NAND memory device of FIG. 2 in an X-X' direction.
Figure 4:
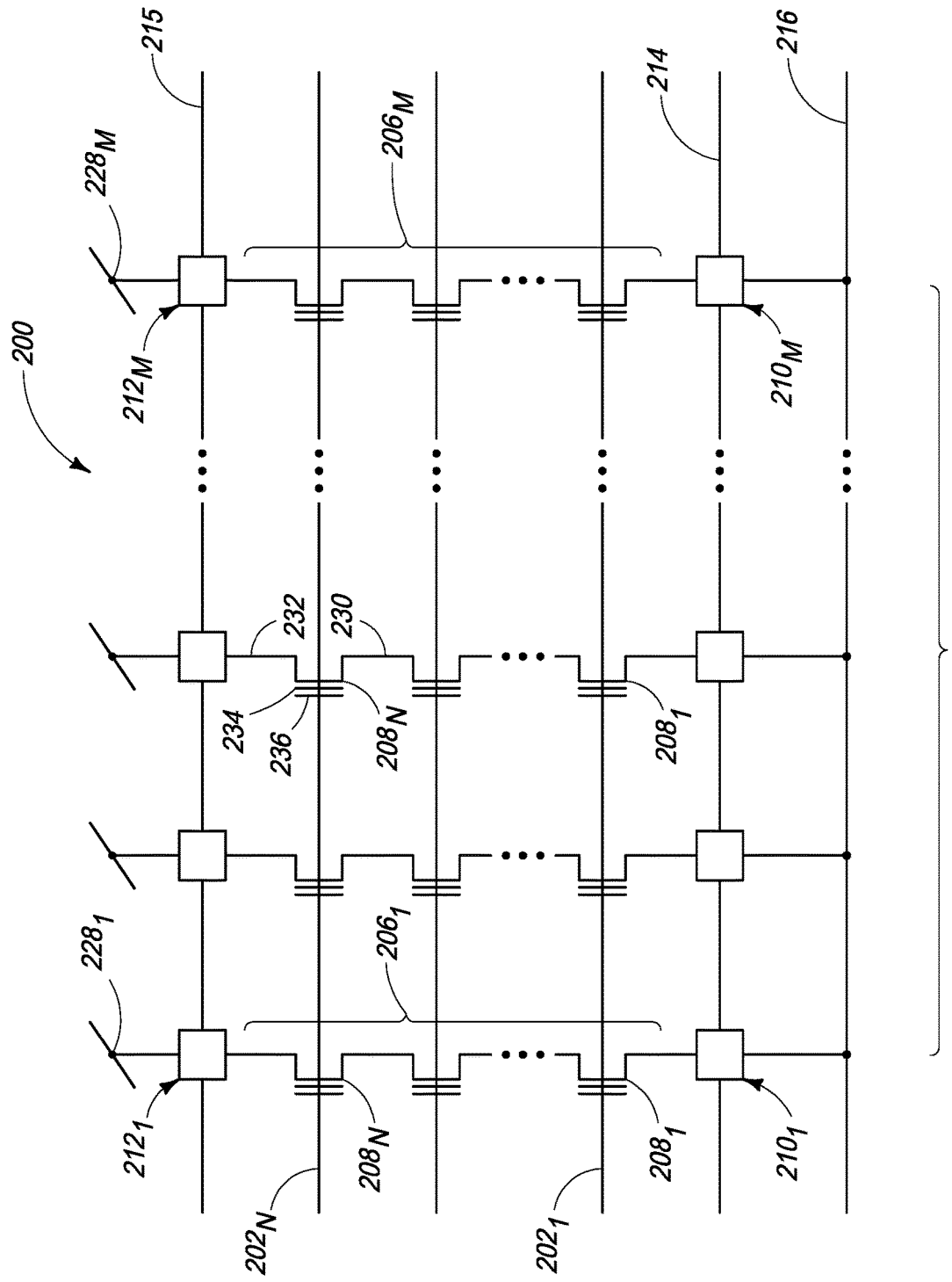
FIG. 4 is a schematic of a prior art NAND memory array.
Figure 5:
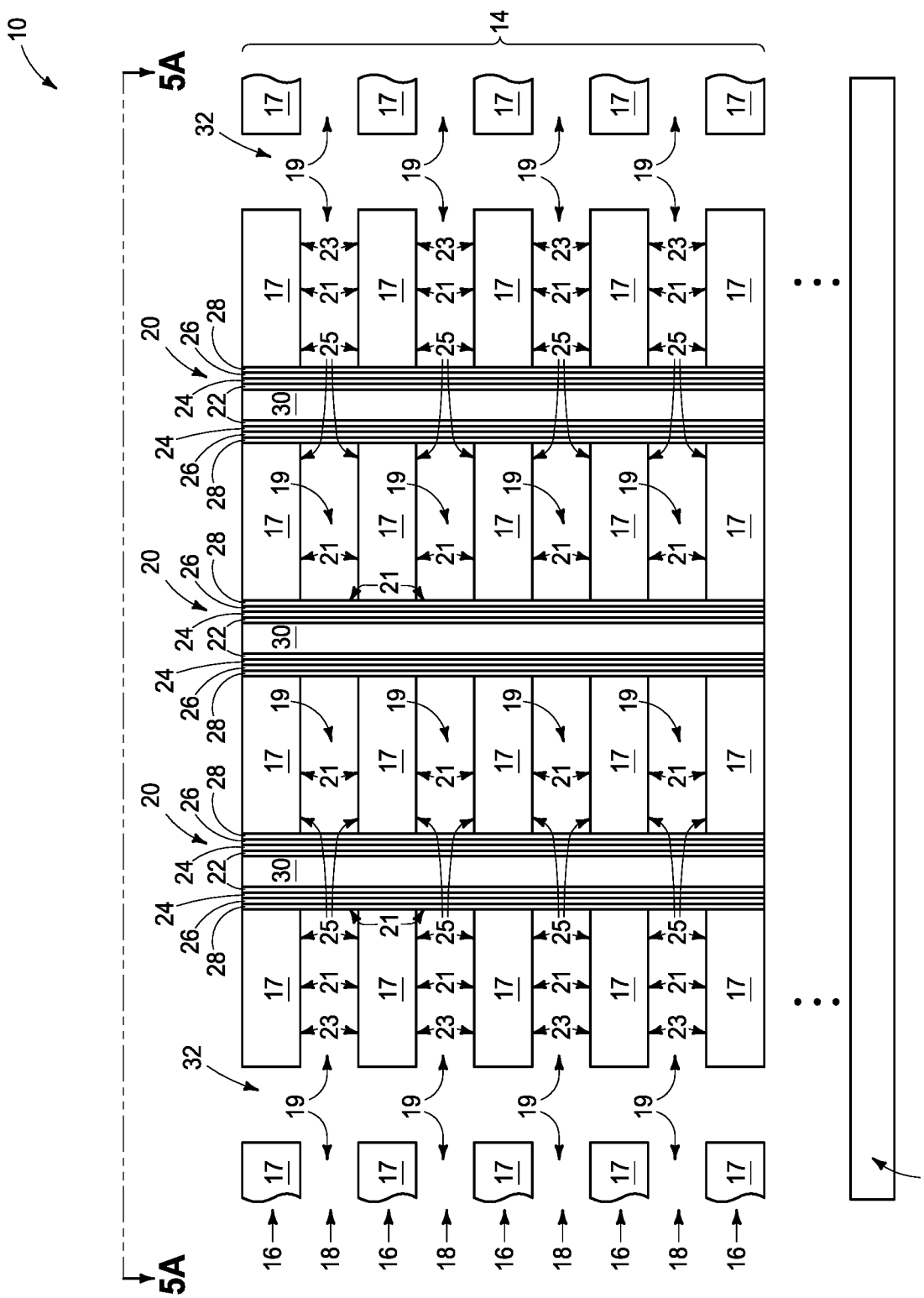
FIGS. 5 and 6 are diagrammatic cross-sectional views of an example assembly at process stages relative to an example method for fabricating example stacked memory cells.
Figure 5A:
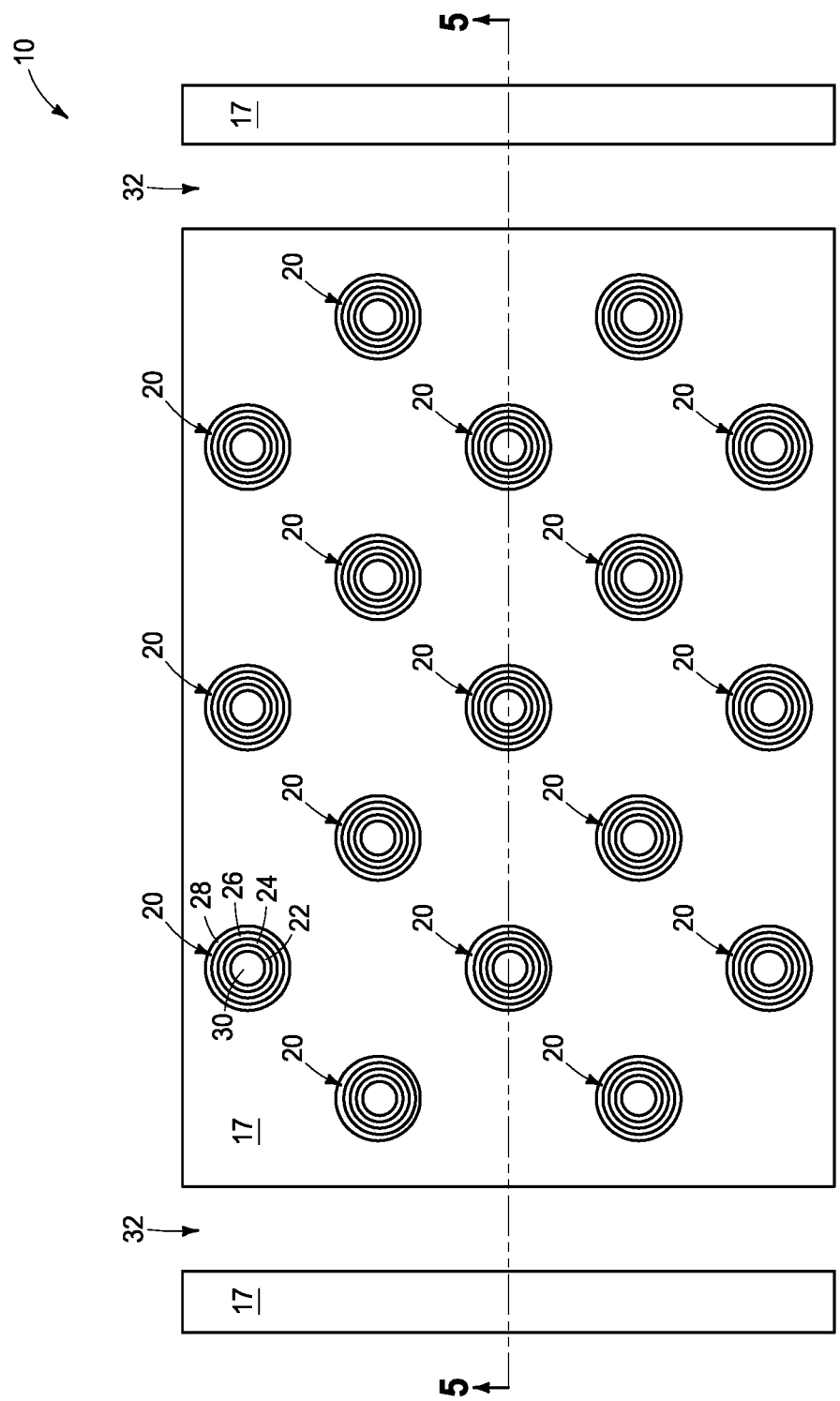
FIG. 5A is a top view of the assembly of FIG. 5. The cross-section of FIG. 5 is along the line 5-5 of FIG. 5A; and the view of FIG. 5A is along the line 5A-5A of FIG. 5.

Referring to FIGS. 5 and 5A, a construction 10 (which may also be referred to as an integrated assembly, or as an integrated structure) includes a stack 14 of alternating first and second levels 16 and 18.

The first levels 16 comprise insulative material 17, and the second levels 18 comprise voids 19. The levels 16 and 18 may be of any suitable thicknesses. The levels 16 may be of different thicknesses than the levels 18, or may be the same thicknesses as the levels 18.

The insulative material 17 may comprise any suitable composition or combination of compositions; and in some embodiments may comprise, consist essentially of, or consist of silicon dioxide.

Ultimately, conductive wordlines (discussed below) are formed within the second levels 18, and such wordlines comprise control gates for memory cells. In some embodiments, the levels 18 may be referred to as memory cell levels of a NAND configuration. The NAND configuration can include a string of memory cells (a NAND string), with the number of memory cells in the string being determined by the number of memory cell levels 18. The NAND string may comprise any suitable number of memory cell levels. For instance, the NAND string may have 8 memory cell levels, 16 and memory cell levels, 32 memory cell levels, 64 memory cell levels, 512 memory cell levels, 1024 memory cell levels, etc.

Structures 20 extend through the stack 14. The structures 20 may be referred to as channel material structures in that they comprise channel material 22. The channel material 22 comprises semiconductor material; and may comprise any suitable composition or combination of compositions. For instance, the channel material 22 may comprise one or more of silicon, germanium, III/V semiconductor materials, semiconductor oxides, etc.

Tunneling material (sometimes referred to as gate dielectric) 24, charge-storage material 26 and charge-blocking material 28 are between the channel material 22 and the vertically-stacked levels 16/18. The tunneling material, charge-storage material and charge-blocking material may comprise any suitable compositions or combinations of compositions.

In some embodiments, the tunneling material 24 may comprise, for example, one or more of silicon dioxide, aluminum oxide, hafnium oxide, zirconium oxide, etc.

In some embodiments, the charge-storage material 26 may comprise charge-trapping materials, such as silicon nitride, silicon oxynitride, conductive nanodots, etc. In alternative embodiments (not shown), charge-storage material 26 may be configured as floating gate material (such as, for example, polycrystalline silicon).

In some embodiments, the charge-blocking material 28 may comprise one or more of silicon dioxide, aluminum oxide, hafnium oxide, zirconium oxide, etc.

In the illustrated embodiment, the channel material 22 is configured as an annular ring within each of the structures 20. Insulative material 30 fills such annular rings. The insulative material 30 may comprise any suitable composition or combination of compositions, such as, for example, silicon dioxide. The illustrated structures 20 may be considered to comprise hollow channel configurations, in that the insulative material 30 is provided within "hollows" in the annular-ring-shaped channel configurations. In other embodiments (not shown), the channel material may be configured as a solid pillar configuration.

The channel material structures 20 may be considered to comprise all of the materials 22, 24, 26, 28 and 30, in combination. The top view of FIG. 5A shows that the channel material structures 20 may be arranged in a hexagonally-packed pattern.

Slits 32 extend through the stack 14. The slits 32 provide access to all of the voids 19 so that such voids may be filled with conductive material during subsequent processing (described below). Although the cross-sectional view of FIG. 5 shows internal voids 19 (i.e., the centrally-located voids) which appear to be blocked from slits 32 by intervening channel material structures 20, it is to be understood that the voids 19 weave around the channel material structures 20. Accordingly, all of the voids 19 along the cross-sectional view of FIG. 5 may be fully accessed through the illustrated slits 32.

The voids 19 may be considered to comprise peripheral boundaries (i.e., edges) 21. The peripheral boundaries may be considered to have proximal regions 23 near the slits 32, and to have distal regions 25 more distant from the slits than the proximal regions 23. In some aspects, the distal regions 25 may be considered to be spaced from the slits 32 by the proximal regions 23.

The stack 14 is over a supporting base 12. The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

A gap is shown between the base 12 and the stack 14 to diagrammatically indicate that there may be one or more additional materials, components, etc., provided between the base 12 and the stack 14. Such additional components may include, for example, conductive source lines, select gates, etc.

The stack 14 of FIG. 5 may be formed with any suitable processing. An example process may comprise initially forming the stack to include sacrificial material within the levels 18 (such sacrificial material may be silicon nitride in some example embodiments), and then removing the sacrificial material after forming the channel material structures 20 and the slits 32 to leave the construction of FIG. 5.

Figure 6:
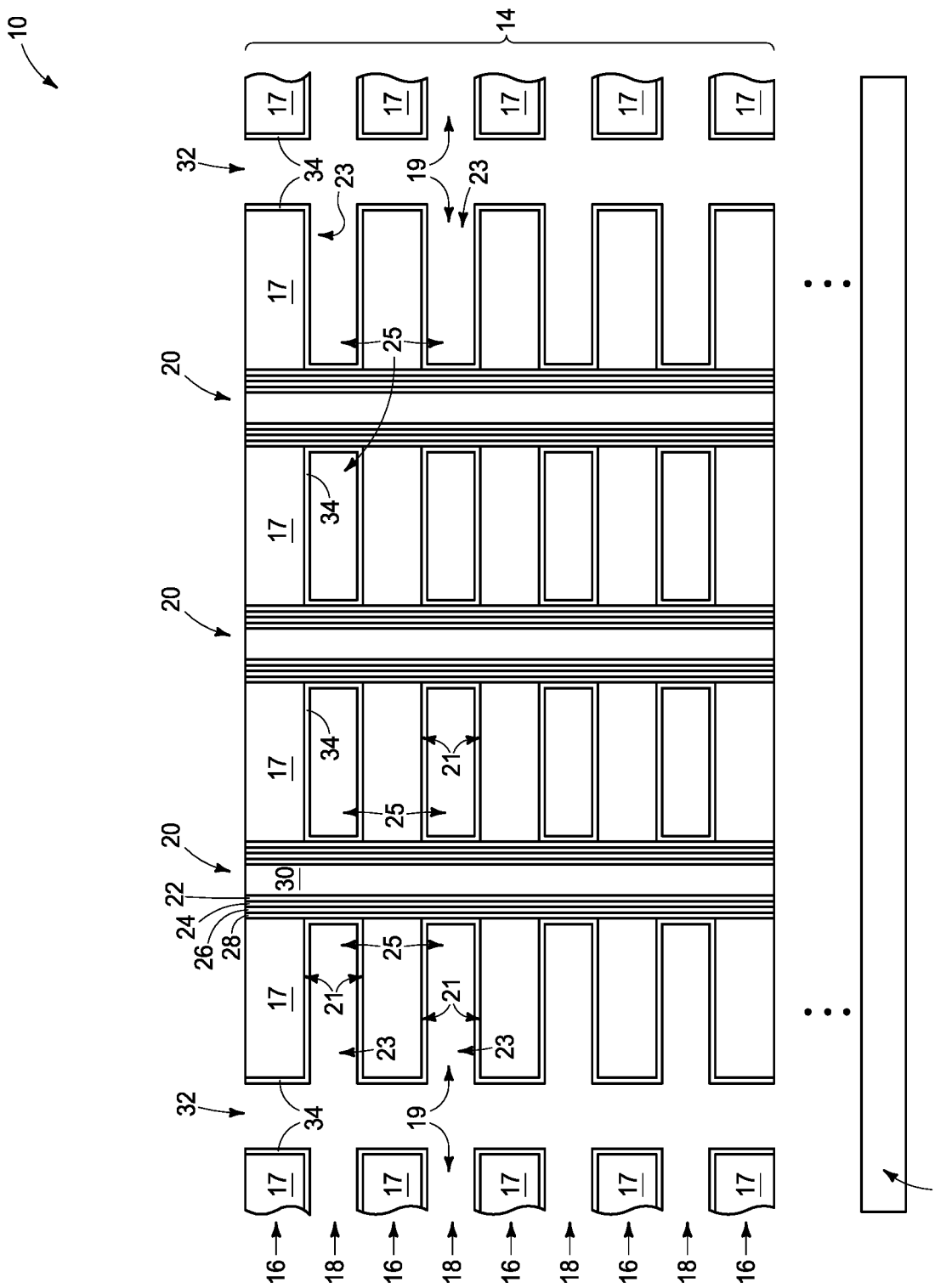
Figure 7:
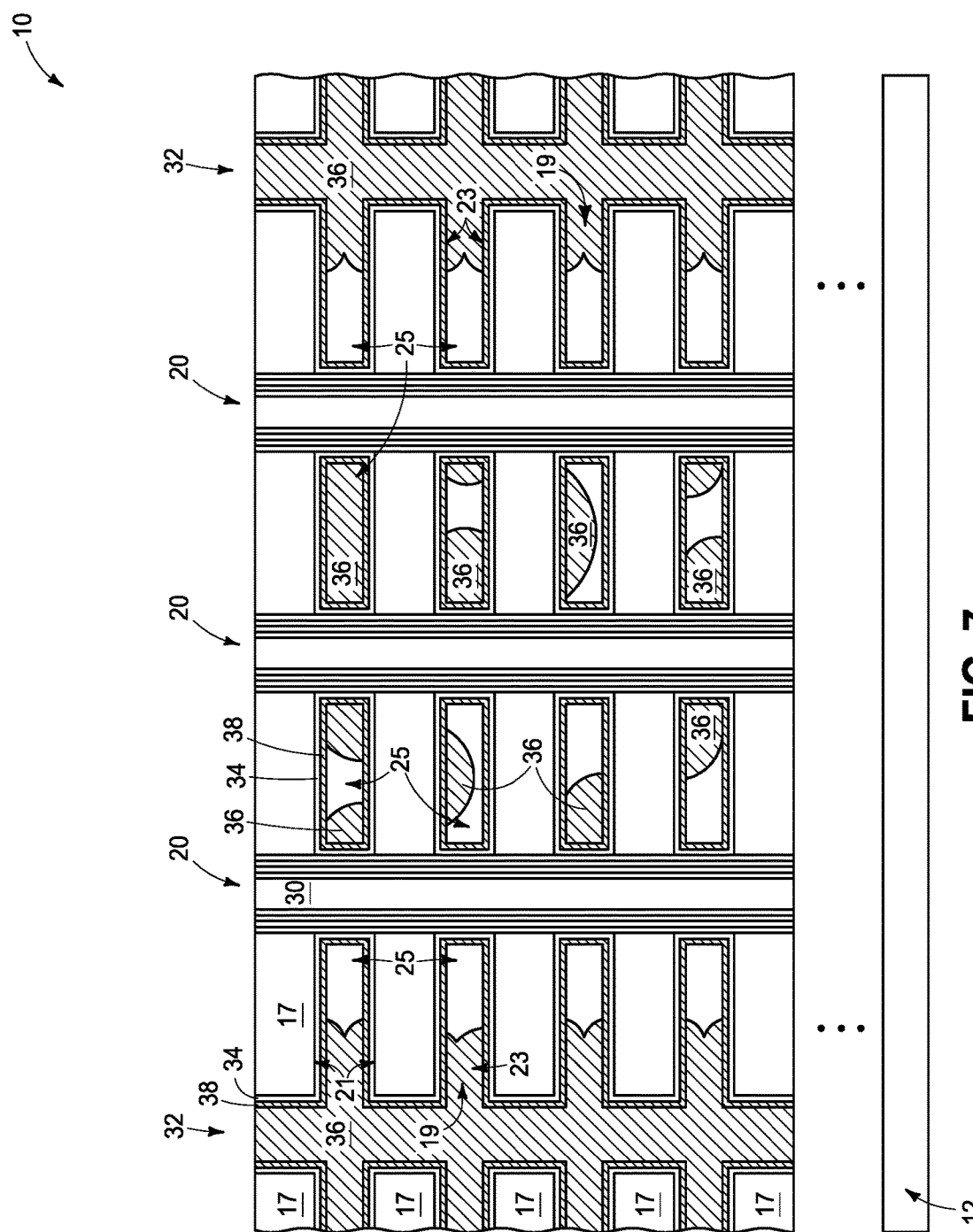
FIG. 7 is a diagrammatic cross-sectional view of a prior art assembly at a process stage following the process stage of FIG. 6.

Referring to FIG. 6, insulative material 34 is deposited along the peripheral boundaries 21 of the voids 19. The material 34 may comprise additional charge-blocking material; and may comprise any suitable composition or combination of compositions. In some embodiments, the material 34 may comprise high-k material (for instance, one or more of aluminum oxide, hafnium oxide, zirconium oxide, tantalum oxide, etc.); where the term "high-k" means a dielectric constant greater than that of silicon dioxide. Although the insulative material 34 is shown to be a single homogenous material, in other embodiments the insulative material may comprise two or more discrete compositions. For instance, in some embodiments the insulative material 34 may comprise a laminate of silicon dioxide and one or more high-k materials. In some embodiments, the material 34 may be considered to form liners within the voids 19. In some embodiments, the charge-blocking material 28 may be omitted so that the material 34 is the only charge-blocking material provided within the assembly of construction 10.

The insulative material 34 may be formed by flowing appropriate precursors through the slits 32 in a deposition process (for instance, an atomic layer deposition process, a chemical vapor deposition process, etc.). The insulative material 34 is shown to extend across both the proximal regions 23 and the distal regions 25 of the peripheral boundaries 21 of the voids 19.

In subsequent processing, conductive material is provided to fill the voids 19 and form conductive wordlines. However, it is found to be difficult to uniformly fill the voids utilizing conventional processes. FIG. 7 shows construction 10 at a processing stage of a prior art process, and illustrates a problem encountered in attempting to fill the voids 19 with a conductive material 36 utilizing conventional processing. Specifically, the conductive material 36 may pinch-off along the proximal regions 23 before filling the voids 19 along the distal regions 25. Accordingly, the distal regions 25 of the voids 19 are not uniformly filled. Such may problematically lead to reduced conductance (i.e., increased resistance) along the conductive wordlines, to excess power being utilized by memory fabricated within the assembly of construction 10, to excess heat generated during utilization of memory fabricated within the assembly of construction 10; and may even lead to device failure.

In the illustrated embodiment of FIG. 7, the conductive material 36 is formed over a conductive liner material 38. In some applications, the conductive liner material 38 may comprise tungsten nitride and the conductive material 36 may comprise tungsten. The liner material 38 may be a material which can be adhered to the insulative material 34, and which provides a surface suitable for adhering the conductive material 36.

Some embodiments include methodology which may be utilized to more uniformly deposit conductive material within the voids 19.

Figure 8:
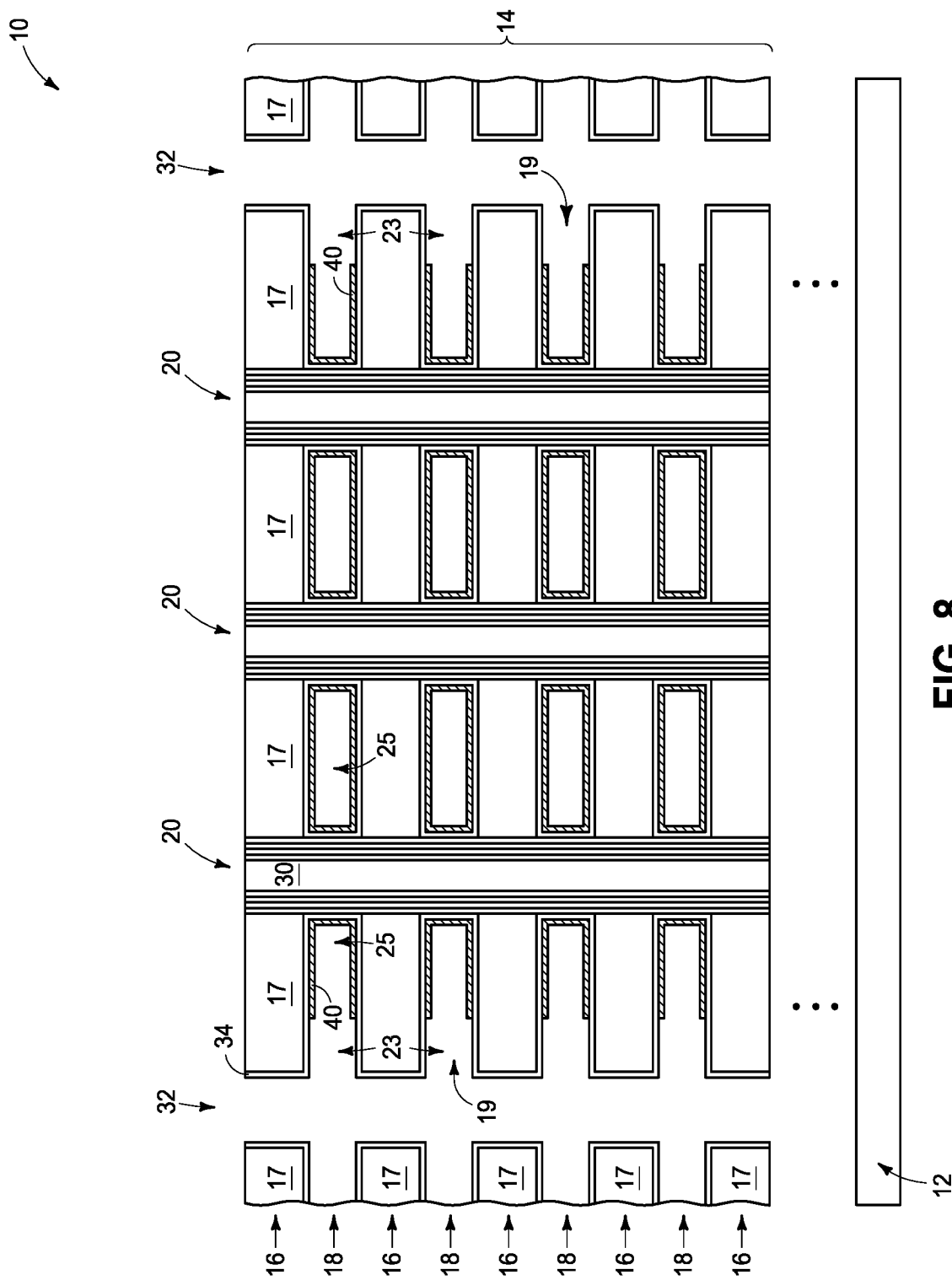
FIGS. 8-10 are diagrammatic cross-sectional views of an example assembly at process stages following the process stage of FIG. 6 relative to an example method for fabricating example stacked memory cells.

Referring to FIG. 8, such shows construction 10 at a processing stage following that of FIG. 6 in accordance with an example embodiment. A conductive material 40 is deposited within the voids 19 under conditions such that the material is selectively formed within the distal regions 25 relative to the proximal regions 23. The material 40 may be a seed material which is subsequently utilized to promote growth of the conductive material 36 (described below with reference to FIG. 9). The material 40 lines the distal regions 25 of the voids 19, and in some embodiments may be referred to as a seed material liner. The material 40 may comprise any suitable composition or combination of compositions. In some embodiments, the seed material may comprise, consist essentially of, or consist of one or more metals selected from the group consisting of tungsten, titanium and cobalt. In some embodiments, the seed material may include one or more of tungsten, titanium and cobalt; and may further include one or more of nitrogen, aluminum, silicon, oxygen, carbon and germanium. In some embodiments, the seed material 40 may comprise, consist essentially of, or consist of metal nitride (for instance, one or more of tungsten nitride, titanium nitride, etc.).

The seed material 40 is deposited by providing appropriate precursors into the voids 19 through the slits 32. In some embodiments, the seed material 40 is selectively deposited over the distal regions 25 relative to the proximal regions 23. Such selective deposition may be accomplished utilizing atomic layer deposition (ALD) with tuned pulses which inhibit a rate of deposition of the seed material 40 along the proximal regions 23 relative to a rate of deposition of the seed material along the distal regions 25. The desired inhibition may be achieved by, for example, including components within the ALD which interfere with the deposition process along the proximal regions 23, but which are sterically or otherwise precluded from penetrating into the distal regions 25 to interfere with the deposition process along such distal regions. Alternatively, the seed material 40 may be formed into the configuration of FIG. 8 by initially depositing the seed material to cover the distal regions 25 and at least portions of the proximal regions 23, and then utilizing one or more etchants to selectively remove the seed material from the proximal regions 23 while leaving the seed material over the distal regions 25. Such etchant(s) may be provided under substantially anisotropic etching conditions to keep the etchant(s) along the proximal regions 23 and out of the distal regions 25; and/or the etchant(s) may be sterically limited from penetrating into the distal regions 25.

Figure 9:
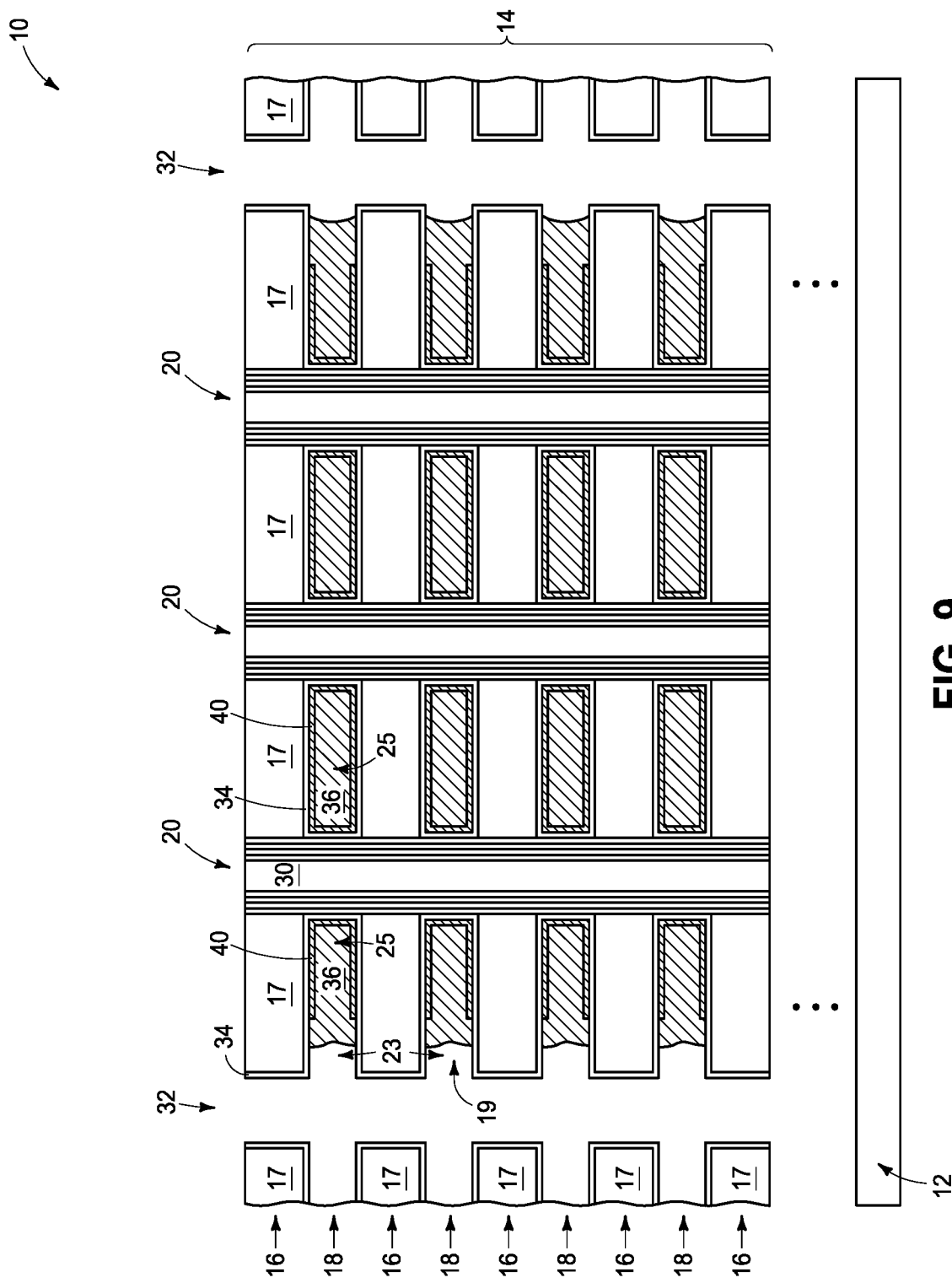

Referring to FIG. 9, the conductive material 36 is deposited onto the seed material 40. Such deposition may include any suitable methodology, including, for example, one or more of atomic layer deposition, chemical vapor deposition, physical vapor deposition, etc. The conductive material 36 selectively grows over the seed material 40 relative to exposed surfaces of the insulative material 34, and accordingly selectively grows along the distal regions 25 relative to the proximal regions 23. Thus, the conductive material 36 may be uniformly grown along the distal regions 25 without the detrimental pinching-off along the proximal regions 23 describe relative to the prior art process stage of FIG. 7.

The conductive material 36 may comprise a different composition relative to the seed material 40. In some embodiments, the conductive material 36 may be referred to as a metal-containing material; and such metal-containing material may comprise, consist essentially of, or consist of one or more of tungsten, titanium, ruthenium, cobalt, nickel and molybdenum. In some embodiments, the metal-containing material 36 may include a metal carbide and/or a metal silicide. For instance, the metal-containing material 36 may include one or more of tungsten, titanium, ruthenium, cobalt, nickel and molybdenum; and may further include one or both of carbon and silicon.

Figure 10:
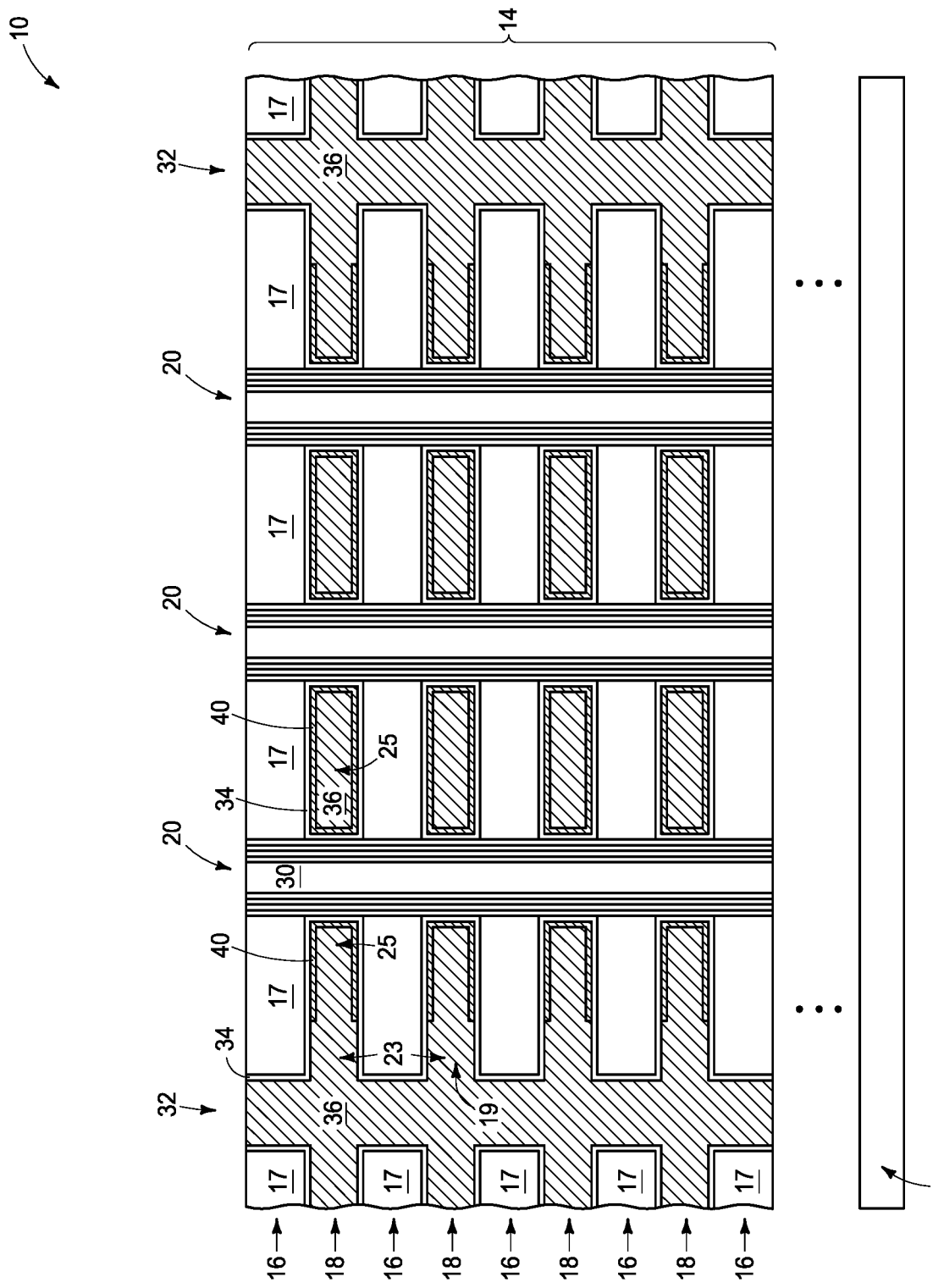

Referring to FIG. 10, a remaining portion of conductive material 36 is grown within the proximal regions 23; with such remaining portion of the conductive material 36 also filling the slits 32. In subsequent processing analogous to that described below with reference to FIGS. 17 and 18, the material 36 may be removed from within the slits and replaced by insulative panels. Such forms conductive wordlines along the levels 18, with such wordlines comprising the conductive materials 36 and 40.

The methodology of FIGS. 8-10 illustrates an example embodiment in which metal-containing material is deposited within the voids 19 under conditions which cause the metal-containing material to form to a greater thickness along the distal regions 25 relative to the proximal regions 23 for an initial duration of the deposition. Such can alleviate, and preferably prevent, the pinching-off problems described above with reference to the prior art process stage of FIG. 7. In the embodiment of FIGS. 8-10, both of the materials 40 and 36 are deposited under conditions which cause the metal-containing materials to form to a greater thickness along the distal regions 25 relative to the proximal regions 23 for initial durations of the depositions. In the case of the material 40, such is formed to a greater thickness along the distal regions 25 relative to the proximal regions 23 for the entire duration of the deposition of such material.

FIGS. 11-16 illustrate additional example embodiments in which metal-containing material may be deposited within the voids 19 under conditions which cause the metal-containing material to form to a greater thickness along the distal regions 25 relative to the proximal regions 23 for an initial duration of the deposition.

Figure 11:
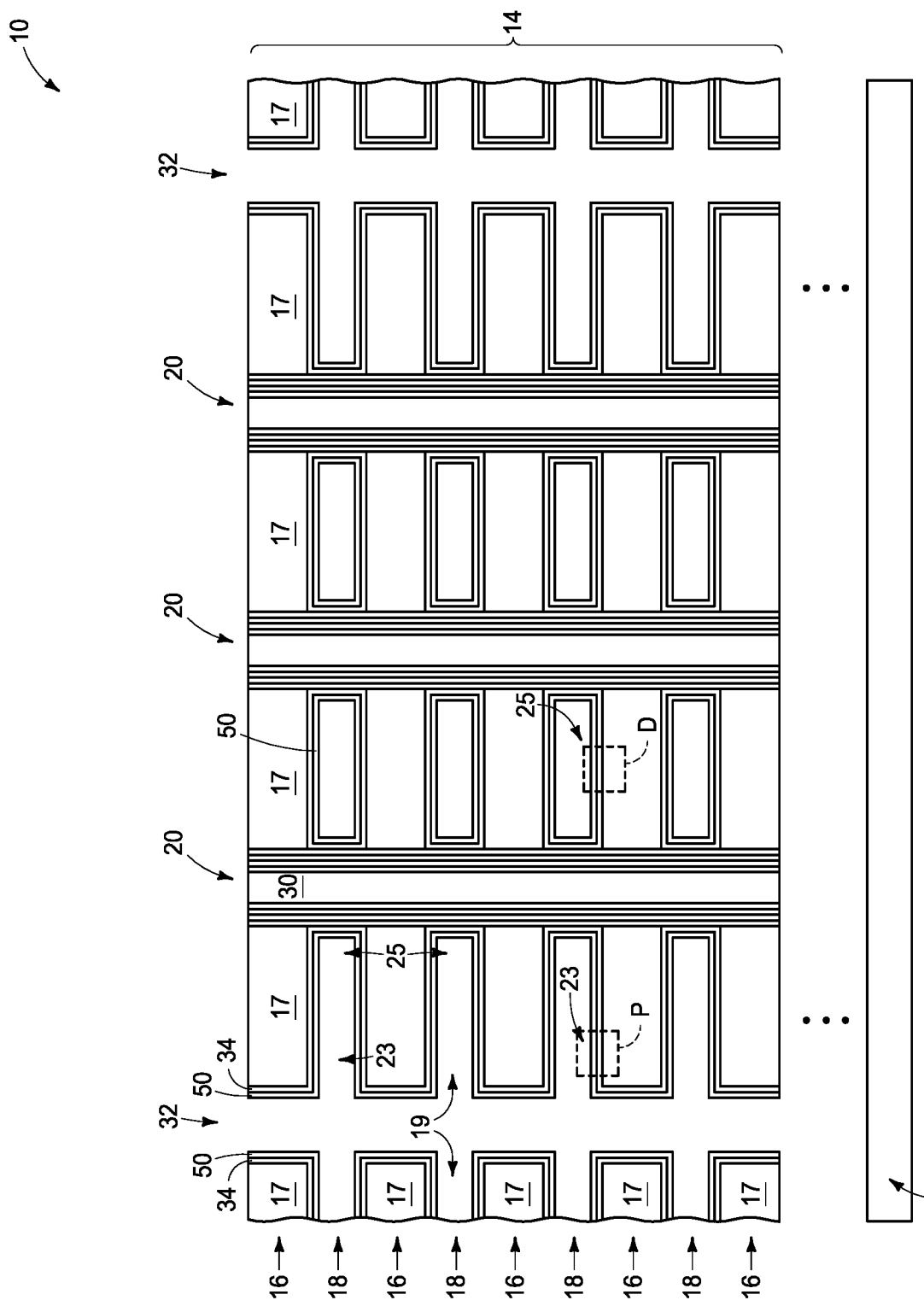
FIG. 11 is a diagrammatic cross-sectional view of an example assembly at a process stage following the process stage of FIG. 6 relative to an example method for fabricating example stacked memory cells.

Referring to FIG. 11, construction 10 is shown at a process stage which may follow that of FIG. 6. A seed material 50 is formed along the insulative material 34 within the voids 19; with the seed material 50 lining the voids 19. In the shown embodiment, the seed material 50 extends along both the proximal regions 23 and the distal regions 25. The seed material 50 may comprise any suitable composition or combination of compositions; and may or may not be conductive. In some embodiments, the seed material 50 is a metal-containing seed material; and may comprise, consist essentially of, or consist of one or more metals selected from the group consisting of tungsten, titanium and cobalt. In some embodiments, the seed material 50 may include one or more of tungsten, titanium and cobalt; and may further include one or more of nitrogen, aluminum, silicon, oxygen, carbon and germanium. In some embodiments, the seed material 50 may comprise, consist essentially of, or consist of metal nitride (for instance, one or more of tungsten nitride, titanium nitride, etc.).

The seed material 50 may comprise a different composition along the distal regions 25 relative to the proximal regions 23. In some embodiments, such difference in composition may enhance growth of the conductive material 36 (FIG. 16) along the distal regions relative to the proximal regions and/or may inhibit growth of the conductive material along the proximal regions relative to the distal regions. Regardless, the difference in composition of seed material 50 along the distal regions 25 relative to the proximal regions 23 may enable the metal-containing material 36 to form to a greater thickness along the distal regions relative to the proximal regions for an initial duration as the material 36 is deposited within the voids 19.

Figure 12:
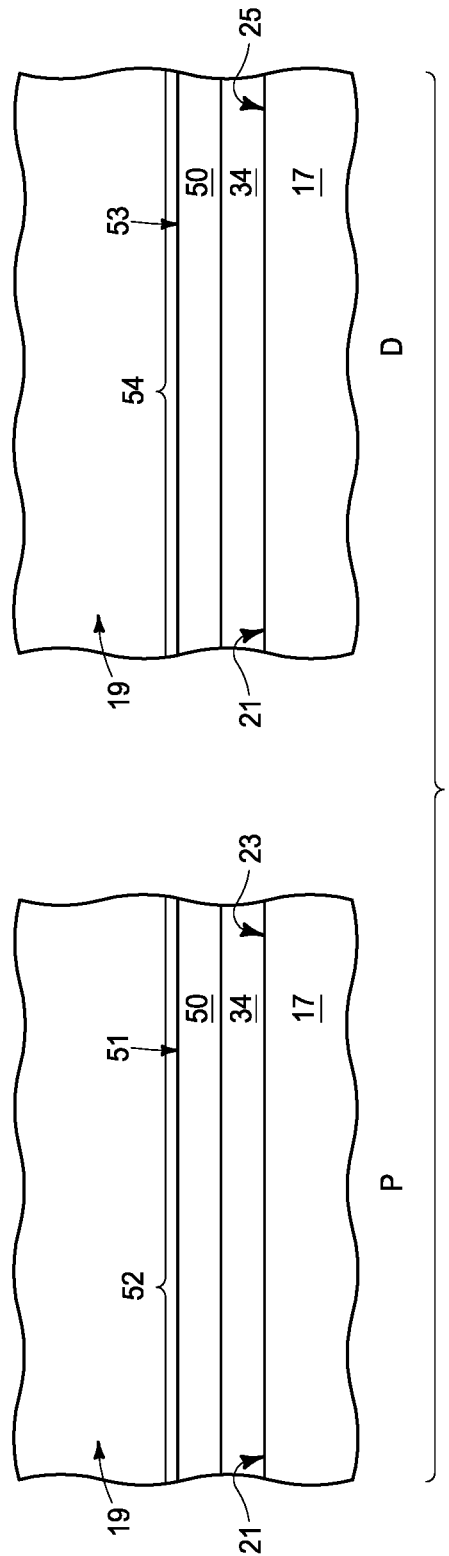

A portion of construction 10 comprising a proximal region 23 is labeled as a region "P", and a portion of the construction comprising a distal region 25 is labeled as a region "D". The regions P and D are shown in FIG. 12. The seed material 50 along the proximal region 23 is part of a first portion 52 of the seed material which has a first surface 51 having a first surface composition, and the seed material 50 along the distal region 25 is part of a second portion 54 of the seed material which has a second surface 53 having a second surface composition. The first and second surface compositions are different from one another, and the metal-containing material 36 (FIG. 16) grows faster along the composition of surface 53 than along the composition of surface 51.

Figure 13:
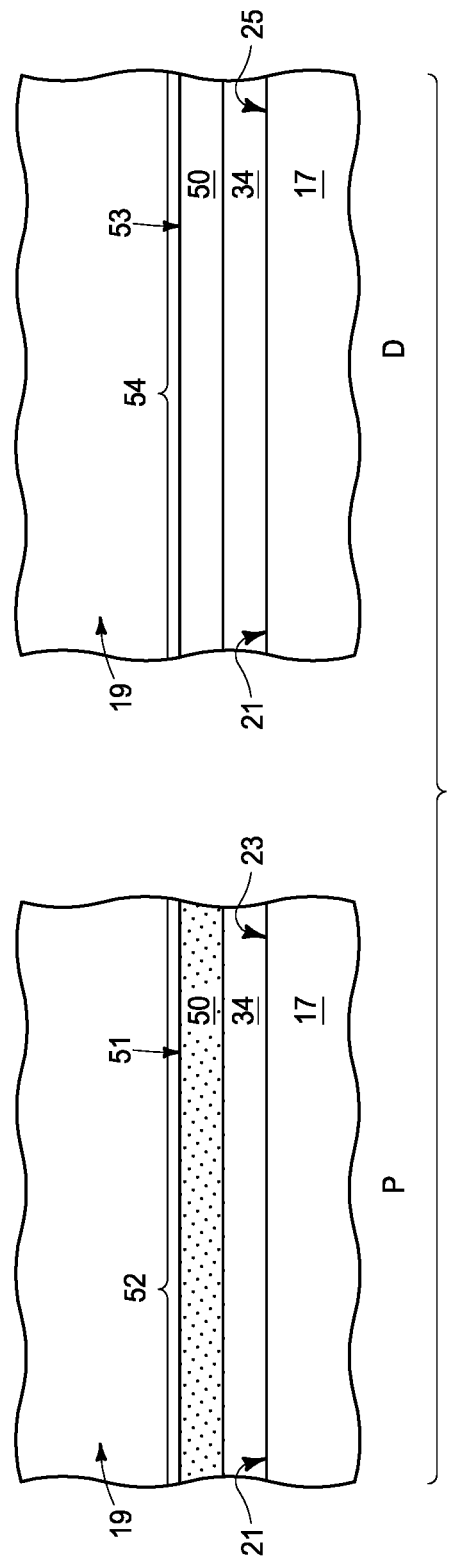
Figure 16:
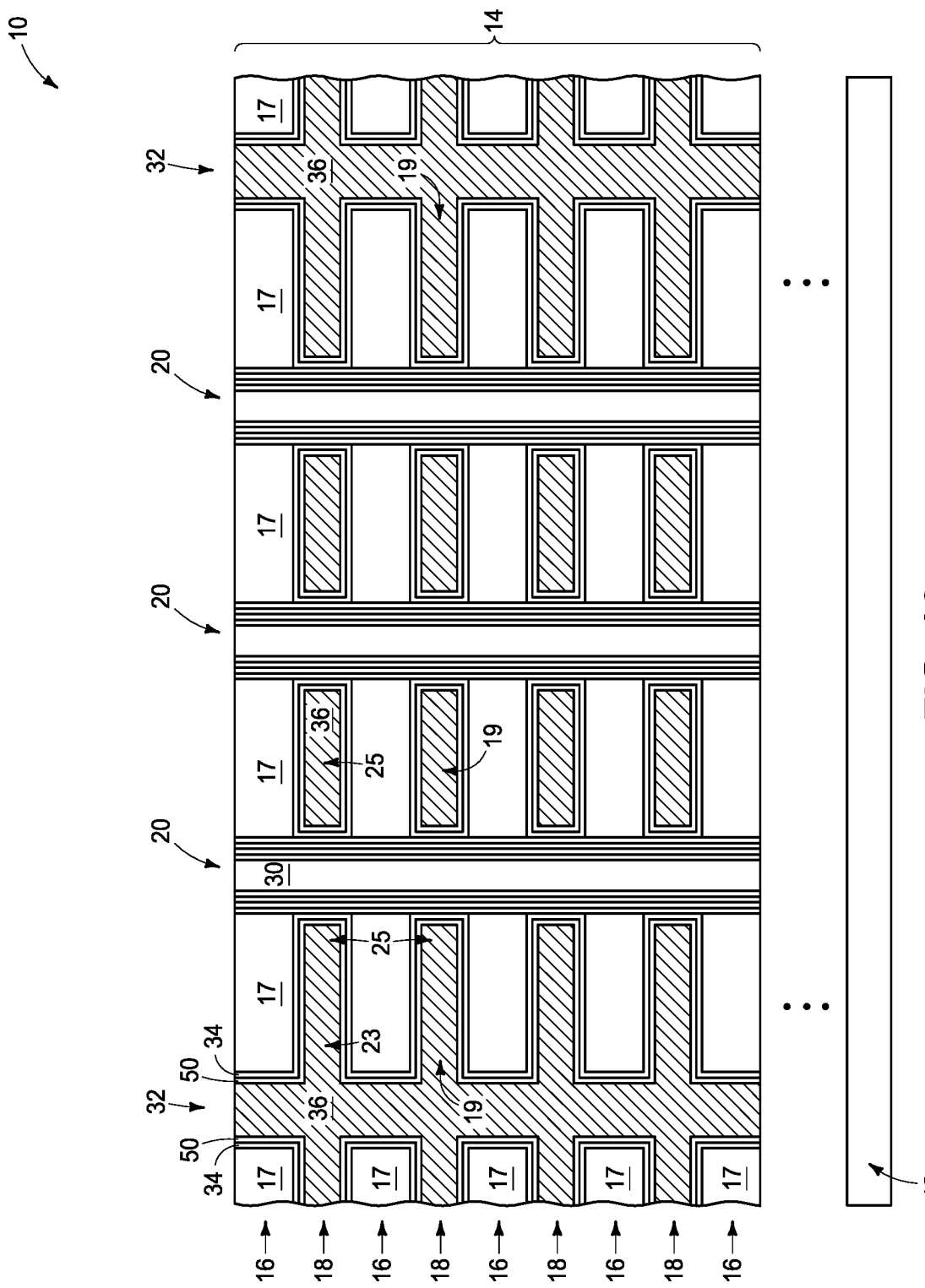
FIGS. 16-18 are diagrammatic cross-sectional views of an example assembly at process stages following the process stage of FIG. 11 relative to an example method for fabricating example stacked memory cells.

FIG. 13 shows an example embodiment in which dopant (illustrated by stippling) is provided within the material 50 along the proximal regions 23, and is not provided (or is provided to a lower concentration) within the material 50 along the distal regions 25. The dopant may slow growth of metal-containing composition 36 (FIG. 16) along the first surfaces 51 of the material 50 relative to the second surfaces 53, and in some embodiments may completely inhibit the growth of the metal-containing composition 36 along the first surfaces 51 of the material 50. The dopant may inhibit the growth of the metal-containing composition 36 by any suitable mechanism. For instance, in some embodiments the dopant may inhibit the growth of the metal-containing material 36 by slowing nucleation of the metal-containing material during a deposition process. Accordingly, the nucleation of the metal-containing material 36 will be slower along the proximal regions 23 than along the distal regions 25, which will result in faster growth of the metal-containing material along the distal regions 25. Regardless of the mechanism by which the growth along the proximal regions 23 is inhibited relative to the growth along the distal regions 25, the relatively faster growth of the metal-containing material 36 along the distal regions 25 may enable all of the voids 19 to be uniformly filled with the material (as illustrated in FIG. 16).

The dopant may be provided within the slits 32 (FIG. 11) under conditions in which the dopant migrates primarily into the portions of the seed material 50 along the proximal regions 23 (i.e., the portion 52 of FIG. 13), and does not migrate into the portions of the seed material 50 along the distal regions 25 (i.e., the portion 54 of FIG. 13). Such may be achieved by providing the dopant under relatively low-power conditions, low bias conditions, etc.; and/or by utilizing dopant which is sterically hindered from migrating deeply into the voids 19.

The processing stage of FIG. 13 may be achieved utilizing any suitable composition of seed material 50, and any suitable dopant.

In some embodiments, the seed material 50 may comprise one or both of tungsten and titanium in combination with nitrogen, and the dopant may comprise boron.

In some embodiments, the seed material 50 may comprise one or both of tungsten and titanium, and the dopant may comprise one or both of boron and nitrogen. For instance, in some embodiments the composition 50 may comprise tungsten in combination with nitrogen, and the portion 52 of material 50 along the proximal region 23 may comprise a higher nitrogen concentration than the portion 54 along the distal region 25. For instance, the portion 54 of material 50 may comprise stoichiometric tungsten nitride (e.g., WN or $W_2N$ depending on the deposition conditions), while the portion 52 of material 50 comprises a concentration of nitrogen in excess of the stoichiometric amount. The portion 52 may additionally comprise boron.

As another example, composition 50 may comprise titanium in combination with nitrogen, and the portion 52 of material 50 along the proximal regions 23 may comprise a higher concentration of nitrogen than the portion 54 along the distal region 25. The portion 52 may additionally comprise boron.

In some embodiments, the first and second portions 52 and 54 of the seed material may both comprise metal, but the first and second surfaces 51 and 53 may comprise different metal-containing compositions relative to one another. For instance, the first surface 51 may primarily comprise (i.e., may comprise more than 50 atomic percent) of a first metal-containing composition, while the second surface 53 primarily comprises a second metal-containing composition different from the first metal-containing composition. Example embodiments are described with reference to FIGS. 14 and 15.

Referring to FIG. 14, the seed material 50 may comprise a base composition (i.e. first composition) 60 which extends across an entirety of the seed material (i.e., extends across both of the portions 52 and 54 of FIG. 14). The base composition may include one or more of tungsten, titanium and cobalt; and in some embodiments may further include one or more of nitrogen, aluminum, silicon, oxygen, carbon and germanium. The base composition is the only composition within the portion 54 of the seed material 50 along the distal region 25. In contrast, the seed material 50 includes a second composition 62 over the base composition 60 within the portion 52 of the seed material along the proximal region 23. The second composition 62 is different from the first composition 60. In some embodiments, the second composition 62 may include one or more of tungsten, titanium and cobalt; and in some embodiments may further include one or more of nitrogen, aluminum, silicon, oxygen, carbon and germanium.

The second composition 62 may inhibit growth of the conductive material 36 (FIG. 16) relative to the first composition 60. Accordingly, the conductive material 36 may be deposited to uniformly fill all of the voids 19 (as illustrated in FIG. 16). In some embodiments, a metal-containing material 36 comprising tungsten will grow more rapidly over titanium nitride than over tungsten nitride. Accordingly, the surface 51 of the seed material 50 along the proximal regions 23 may primarily comprise tungsten nitride, while the surface 53 of the seed material 50 along the distal regions 25 primarily comprises titanium nitride. Accordingly, the composition of the surface 51 of the seed material 50 along proximal regions 23 may retard growth of the metal-containing material 36 relative to the composition of the surface 53 along the distal regions 25.

The second composition 62 may be formed as a laminate over the first composition 60 (as shown in FIG. 14A relative to a region labeled "E" in FIG. 14), or may be formed as a gradient extending upwardly from the first composition 60 (as shown in FIG. 14B relative to the region E). The gradient of metal within the second composition 62 is diagrammatically represented in FIG. 14B by showing an increase in concentration of the metal (with the metal concentration being shown as "[X]") from the bottom of the composition 62 to the top of the composition 62.

In some embodiments, the first and second portions 60 and 62 may both comprise two or more metals, and a relative proportion of the metals may vary in the second portion 62 relative to the first portion 60. For instance, in some embodiments it is found that a metal-containing material 36 comprising tungsten will grow more rapidly over titanium nitride than over tungsten nitride. The first and second portions 60 and 62 may both comprise a combination of titanium nitride and tungsten nitride, and the relative amount of tungsten nitride may be higher in the region 62 than in the base region 60. For instance, in some embodiments the region 62 may primarily comprise tungsten nitride, while the region 60 primarily comprises titanium nitride. A dashed line is utilized in FIG. 14B to indicate that the metal-containing material (e.g., tungsten nitride) within portion 62 of the material 50 is present in both of the portions 60 and 62 of material 50, with [X] indicating the increasing amount of such metal-containing material along a gradient toward a surface of the portion 62.

In some embodiments, the first and second portions 60 and 62 may comprise two or more metals selected from the group consisting of tungsten, titanium and cobalt, with one of said two or more metals being a primary component of the base portion 60, and the other being a primary component of the second portion 62. The metals may be part of metal-containing compositions; and in some embodiments may be in the form of one or more of metal carbide, metal silicide, metal nitride, etc.

FIG. 15 shows an embodiment analogous to that of FIG. 14, except that the additional material (second material) 62 is provided over the portion 54 of material 50 along the distal regions 25, rather than being provided over the portion 52 of the material 50 along the proximal regions 23. In the embodiment of FIG. 14, the second material 62 was utilized to retard growth of metal-containing material 36 (FIG. 16) along the proximal regions 23. In contrast, the second material 62 utilized in the embodiment of FIG. 15 may be provided to enhance growth of the metal-containing material 36 along the distal regions 25. For instance, in some embodiments the base material 60 of FIG. 15 may comprise tungsten nitride, the second material 62 may comprise titanium nitride, and the metal-containing material 36 (FIG. 16) may comprise tungsten.

The constructions of FIGS. 14 and 15 may be formed with any suitable processing. For instance, the base region 60 of seed material 50 may be initially deposited under conditions which form the base region 60 to be of substantially uniform thickness along the proximal regions 23 and distal regions 25 (with the term "substantially uniform thickness" meaning uniform thickness to within reasonable tolerances of fabrication and measurement). Subsequently, the additional region 62 of base material 50 may be deposited under conditions which either form the additional region 62 primarily along the proximal regions 23 as opposed to the distal regions 25 (for the embodiment of FIG. 14), or which form the additional region 62 primarily along the distal regions 25 as opposed to the proximal regions 23 (for the embodiment of FIG. 15). The deposition of the composition of the additional region 62 may be controlled by, for example, bias conditions, power conditions, stearic properties of one or more precursors, etc., in order to provide such composition to be primarily over one of the proximal/distal regions 23/25 relative to the other of the proximal/distal regions 23/25.

Referring to FIG. 16, the construction 10 is shown at a process stage following that of FIG. 11. The conductive material 36 is provided within the slits 32, and is deposited within the voids 19. The seed material 50 of FIG. 16 may comprise distal regions 25 and proximal regions 23 which are modified relative to one another in accordance with the embodiments described with reference to FIGS. 11-15. The material 36 uniformly deposits within the voids 19 due to the material 36 forming to a greater thickness along the distal regions 25 relative to the proximal regions 23 during an initial duration of the deposition.

Figure 17:
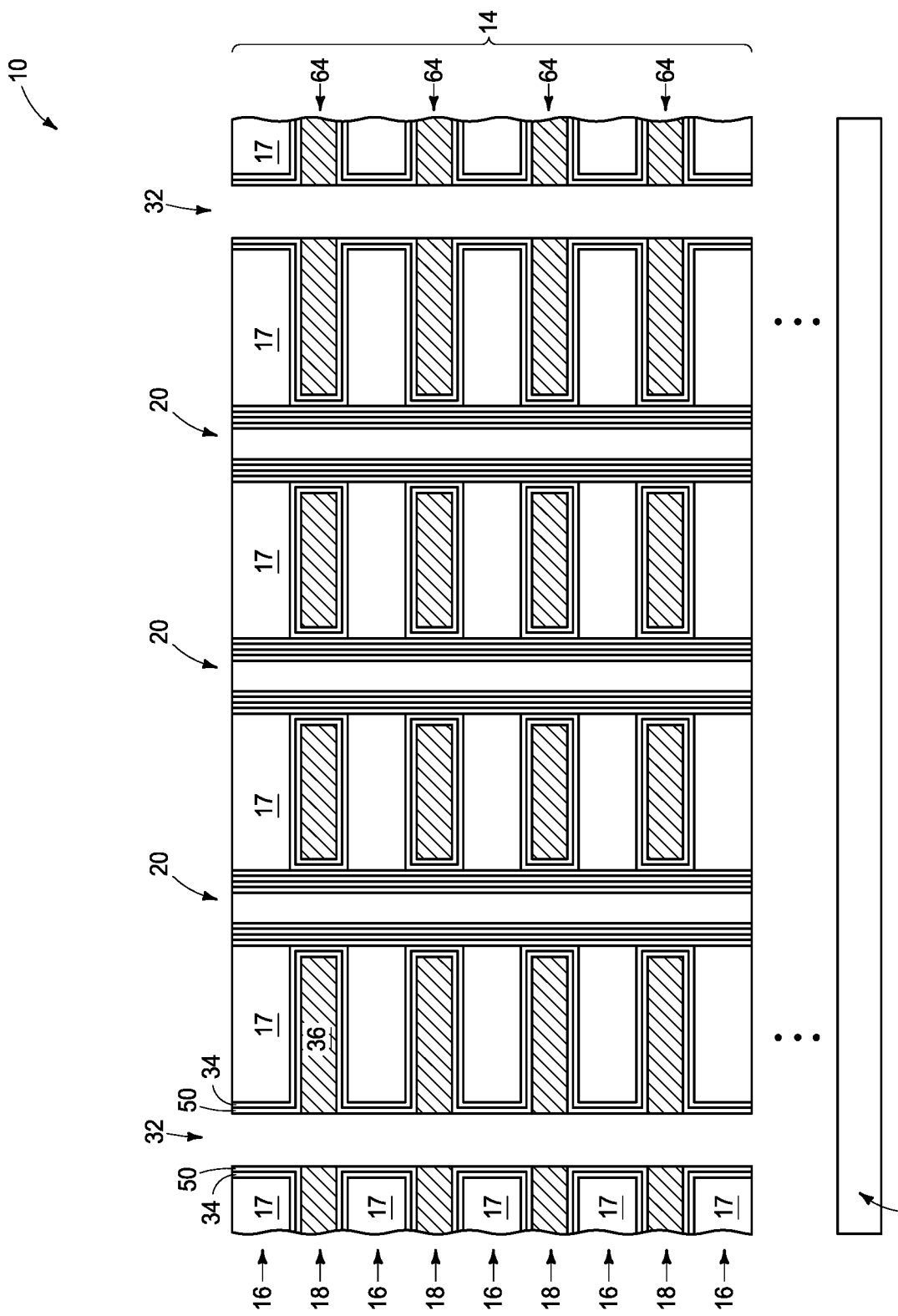

Referring to FIG. 17, conductive material 36 is removed from slits 32 with one or more suitable etches. The remaining conductive material 36 forms conductive wordlines 64 along the second levels 18.

Figure 18:
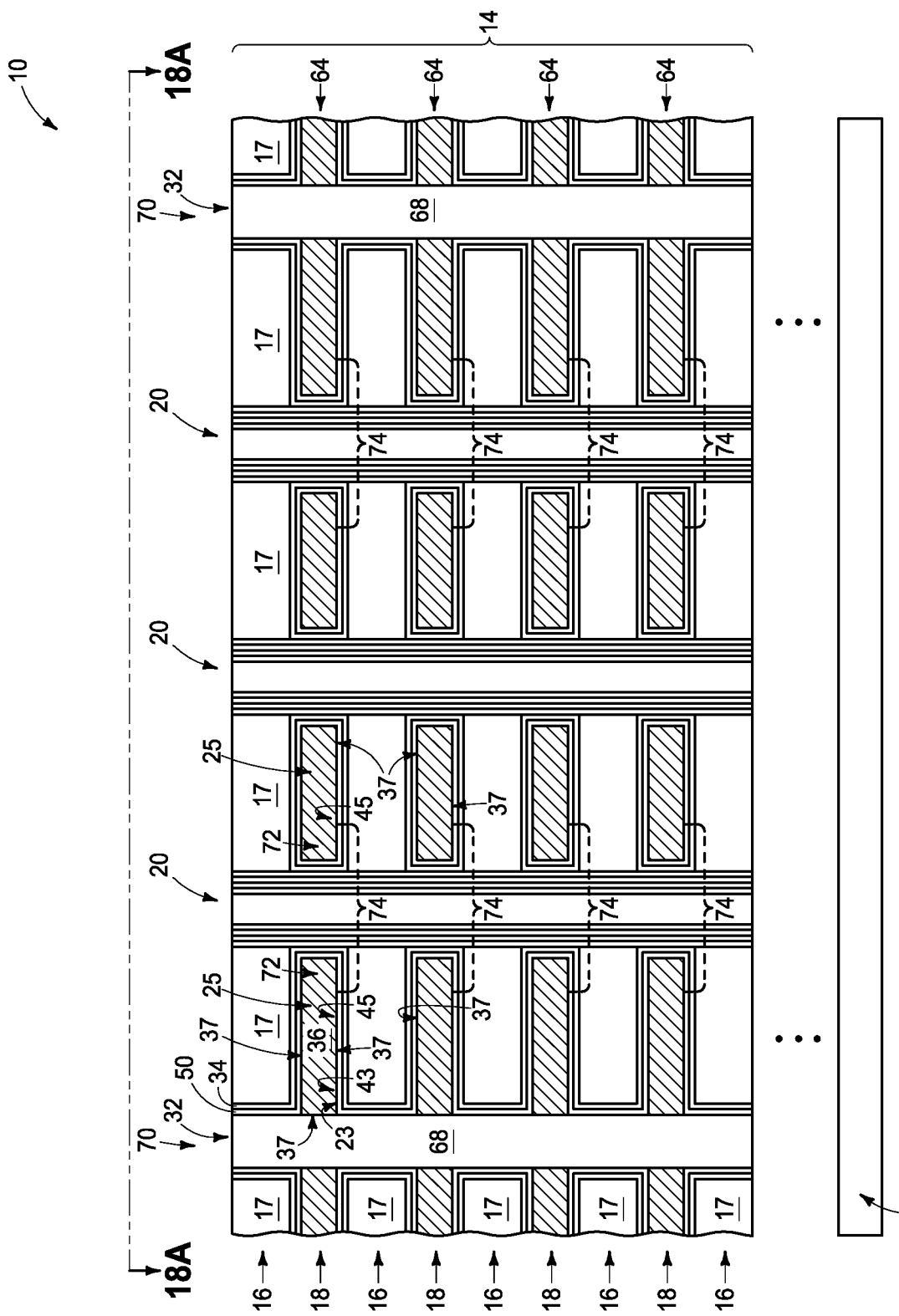
Figure 18A:
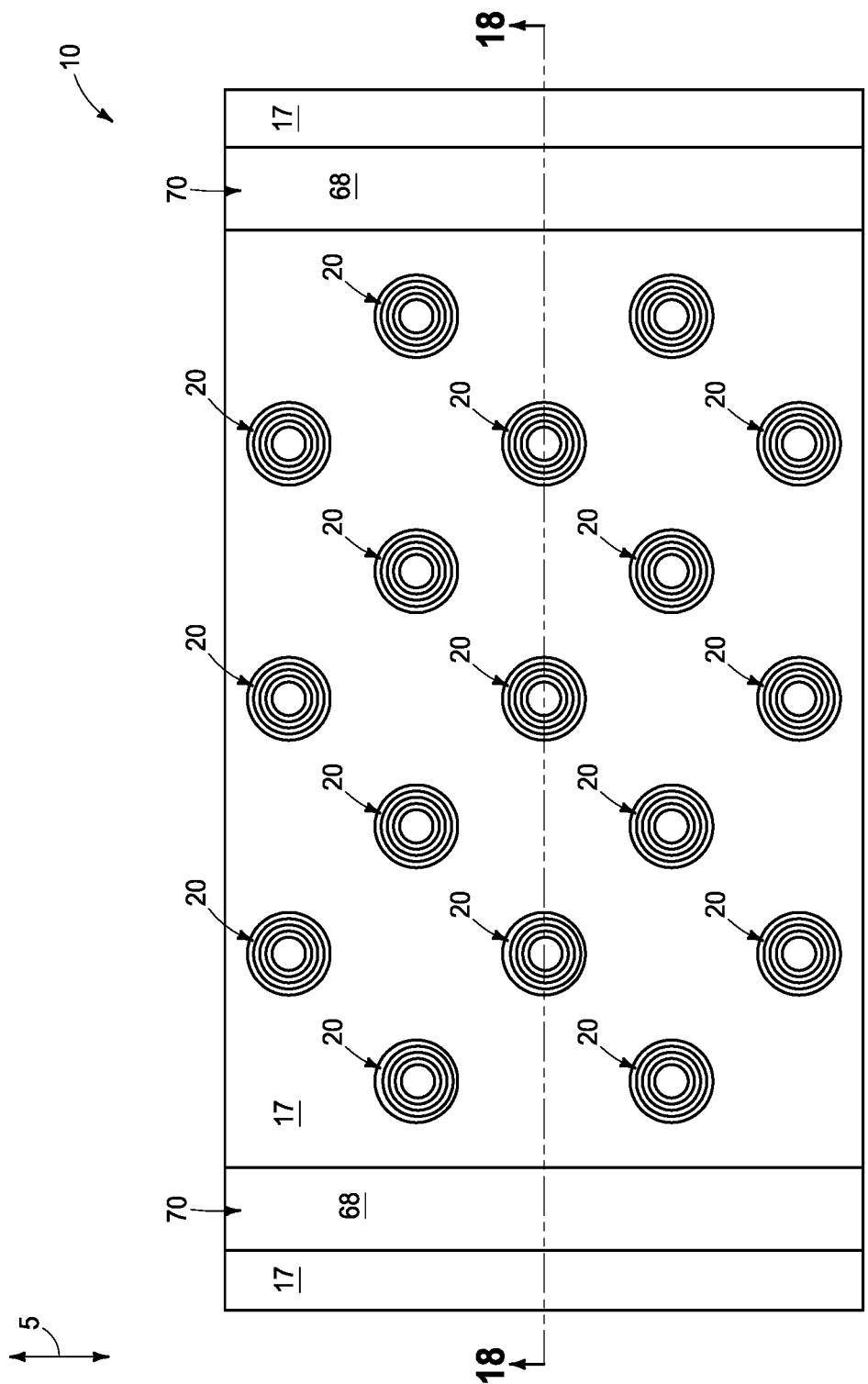
FIG. 18A is a top view of the assembly of FIG. 18. The cross-section of FIG. 18 is along the line 18-18 of FIG. 18A; and the view of FIG. 18A is along the line 18A-18A of FIG. 18.

Referring to FIGS. 18 and 18A, the slits 32 are filled with insulative material 68. The insulative material 68 within the slits is configured as panels 70 which extend longitudinally along an axis 5 (provided adjacent the top view of FIG. 18A).

The wordlines 64 comprise gate regions 72 adjacent the channel material structures 20; and the gate regions together with materials in the channel material structures form a plurality of vertically-stacked memory cells 74. Such memory cells may be NAND memory cells of a three-dimensional NAND memory array. In some embodiments, the insulative panels 70 may be utilized to subdivide the memory array amongst blocks, or at least partial blocks, (with a "block" corresponding to a collection of memory cells which are erased simultaneously in a block-erase operation).

The conductive material 36 within the second levels 18 (i.e., the conductive wordlines 64) may be considered to comprise outer edges 37. Such outer edges have proximal regions 43 near the panels 70, and along the proximal regions 23 discussed above with reference to FIG. 5. The outer edges 37 of the conductive wordlines 64 also comprise distal regions 45 along the distal regions 25 discussed above with reference to FIG. 5. The distal regions 45 are spaced from the insulative panel structures 70 by the proximal regions 43. The seed material 50 may be considered to be an interface material between the outer edges 37 of the wordlines 64 and the insulative material 34. The interface material 50 is along the outer edges 37 of the wordline 64 (i.e., is along the outer edges of the conductive material 36).

The interface material 50 may comprise a different composition along the proximal regions 43 of the outer edges 37 than along the distal regions 45 of the outer edges 37; and specifically, may comprise the compositions described above with reference to FIGS. 8-15.

In some embodiments, the interface material 50 may include boron (or other suitable dopant) along the proximal regions 43 of the outer edges 37, and not along the distal regions 45 of the outer edges.

In some embodiments, the interface material 50 may include two or more metals, with one of the metals being a primary component along the proximal regions 43, and another of the metals being a primary component along the distal regions 45.

In some embodiments, the interface material 50 may comprise tungsten nitride and titanium nitride, with the tungsten nitride being a primary component adjacent the surfaces 37 of the conductive material 36 within proximal regions 43, and with the titanium nitride being a primary component adjacent the surfaces 37 of the conductive material 36 within the distal regions 45.

In some embodiments, the interface material 50 may be a metal-containing interface material comprising two or more metals. A first metal of said two or more metals may be the primary metal of a first surface composition along the proximal regions 43 of the surfaces 37 of wordlines 64 (i.e., the surfaces 37 of the conductive material 36 within the second levels 18), and a second metal of said two or more metals may be the primary metal of a second surface composition along the distal regions 45 of the surfaces 37. In some embodiments, the first and second surface compositions may comprise metal nitrides. For instance, the first surface composition (i.e., the composition of interface material 50 along proximal regions 43) may comprise tungsten nitride, and the second surface composition (i.e., the composition of interface material 50 along the distal regions 45) may comprise titanium nitride.

In some embodiments, the first and second surface compositions may correspond to surfaces along the first and second portions 60 and 62 of material 50 described above with reference to FIGS. 14 and 15. The "first surface composition" may be either of the first and second portions 60 and 62, and the "second surface composition" will be the other of the first and second portions 60 and 62. In some embodiments, the portions 60 and 62 may be comprised by a laminate structure (FIGS. 14A and 15A), or a gradient structure (FIGS. 14B and 15B).

The assemblies discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a method of forming an integrated structure. An assembly is formed to include a stack of alternating first and second levels. The first levels are insulative levels which comprise insulative material. The second levels comprise voids between the insulative levels. The assembly includes channel material structures extending through the stack, and includes slits extending through the stack. The voids have peripheral boundaries, and open into the slits. The peripheral boundaries have proximal regions near the slits and distal regions spaced from the slits by the proximal regions. A metal-containing material is deposited within the voids under conditions which cause the metal-containing material to form to a greater thickness along the distal regions relative to the proximal regions for an initial duration of the of the deposition.

Some embodiments include an assembly having a stack of alternating first and second levels. The first levels include insulative material, and the second levels include conductive material. The assembly includes channel material structures extending through the stack, and includes insulative panel structures extending through the stack. The conductive material within the second levels has outer edges. The outer edges have proximal regions near the insulative panel structures and distal regions spaced from the insulative panel structures by the proximal regions. Interface material is along the outer edges of the conductive material. The interface material has a different composition along the proximal regions of the outer edges than along the distal regions of the outer edges.

Some embodiments include an assembly having a stack of alternating first and second levels. The first levels comprise insulative material, and the second levels comprise conductive material. The assembly includes channel material structures extending through the stack, and includes insulative panel structures extending through the stack. The conductive material within the second levels has outer edges. The outer edges have proximal regions near the insulative panel structures and distal regions spaced from the insulative panel structures by the proximal regions. Metal-containing interface material is along the outer edges of the conductive material. The metal-containing interface material has a first surface composition along the proximal regions of the outer edges and has a second surface composition along the distal regions of the outer edges. The metal-containing interface material comprises two or more metals. A first metal of said two or more metals is the primary metal of the first surface composition, and a second metal of said two or more metals is the primary metal of the second surface composition.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An assembly, comprising:
   a stack of alternating first and second levels; the first levels comprising insulative material, and the second levels comprising conductive material;
   channel structures extending through the stack;
   the second levels comprising distal regions adjacent the channel structures and proximal regions spaced from the channel structures; and
   the conductive material of the second levels comprising:
      a conductive core in the distal and proximal regions; and
      a liner of seed material surrounding at least a portion of the conductive core in at least one of the distal and proximal regions wherein the liner of seed material exists in the proximal regions, the liner of seed comprising a first composition and a second composition over the first composition, the first composition different from the second composition.

2. The assembly of claim 1 wherein the liner of seed material surrounds an entirety of the conductive core in the distal regions.

3. The assembly of claim 1 wherein the liner of seed material surrounds at least a portion of the conductive core in the proximal regions.

4. The assembly of claim 1 wherein the liner of seed material surrounds only a portion of the conductive core in the proximal regions.

5. The assembly of claim 1 wherein the liner of seed material does not surround any portion of the conductive core in the proximal regions.

6. The assembly of claim 1 wherein the liner of seed material surrounds at least a portion of the conductive core in both of the proximal and distal regions, the liner of seed material being thicker in the distal regions.

7. The assembly of claim 1 wherein the liner of seed material surrounds at least a portion of the conductive core in the distal regions.

8. The assembly of claim 1 wherein the conductive core is thicker in the distal regions than in the proximal regions.

9. The assembly of claim 1 wherein the second composition is configured as a laminate over the first composition.

10. The assembly of claim 1 wherein the second composition is configured as a gradient of material over the first composition.

11. The assembly of claim 10 wherein the gradient of material of the second composition increases as second composition extends upward from the first composition.

12. An assembly comprising:
    a stack of alternating first and second levels; the first levels comprising insulative material, and the second levels comprising conductive material;
    channel structures extending through the stack;
    the second levels comprising distal regions adjacent the channel structures and proximal regions spaced from the channel structures; and
    the conductive material of the second levels comprising:
       a conductive core in the distal and proximal regions;
       a liner of seed material surrounding at least a portion of the conductive core in at least one of the distal and proximal regions; and
    wherein the liner of seed material exists in the distal regions, the liner of seed comprising a first composition and a second composition over the first composition, the first composition different from the second composition.

13. The assembly of claim 12 wherein the second composition is configured as a laminate over the first composition.

14. The assembly of claim 12 wherein the second composition is configured as a gradient of material over the first composition.

15. The assembly of claim 14 wherein the gradient of material of the second composition increases as second composition extends upward from the first composition.

16. The assembly of claim 1 further comprising an insulative panel extending through the stack.

17. An assembly, comprising:
    a stack of alternating first and second levels; the first levels comprising insulative material, and the second levels comprising conductive material;
    channel structures extending through the stack;
    the second levels comprising distal regions adjacent the channel structures and proximal regions spaced from the channel structures; and
    the conductive material of the second levels comprising:
       a conductive core in the distal and proximal regions;
       a liner of seed material surrounding at least a portion of the conductive core in at least one of the distal and proximal regions; and
    wherein the liner of seed material exists in both of the distal and proximal regions, the liner in the distal regions comprising a composition different from a composition of the liner in the proximal regions.

18. An assembly, comprising:
    a stack of alternating first and second levels; the first levels comprising insulative material, and the second levels comprising conductive material;

channel structures extending through the stack;
the second levels comprising distal regions adjacent the channel structures and proximal regions spaced from the channel structures; and
the conductive material of the second levels comprising:
a conductive core in the distal and proximal regions; and
a liner of seed material surrounding at least a portion of the conductive core in at least one of the distal and proximal regions;
wherein the liner of seed material exists in the proximal regions, the liner of seed comprising a first composition and a second composition over the first composition, the first composition different from the second composition.

19. The assembly of claim 18 wherein the second composition is configured as a laminate over the first composition.

20. The assembly of claim 18 wherein the second composition is configured as a gradient of material over the first composition.

21. The assembly of claim 20 wherein the gradient of material of the second composition increases as second composition extends upward from the first composition.

22. An assembly, comprising:
a stack of alternating first and second levels; the first levels comprising insulative material, and the second levels comprising conductive material;
channel structures extending through the stack;
the second levels comprising distal regions adjacent the channel structures and proximal regions spaced from the channel structures; and
the conductive material of the second levels comprising:
a conductive core in the distal and proximal regions; and
a liner of seed material surrounding at least a portion of the conductive core in at least one of the distal and proximal regions;
wherein the liner of seed material exists in the distal regions, the liner of seed comprising a first composition and a second composition over the first composition, the first composition different from the second composition.

23. The assembly of claim 22 wherein the second composition is configured as a laminate over the first composition.

24. The assembly of claim 22 wherein the second composition is configured as a gradient of material over the first composition.

25. The assembly of claim 24 wherein the gradient of material of the second composition increases as second composition extends upward from the first composition.

26. An assembly, comprising:
a stack of alternating first and second levels; the first levels comprising insulative material, and the second levels comprising conductive material;
channel structures extending through the stack;
the second levels comprising distal regions adjacent the channel structures and proximal regions spaced from the channel structures; and
the conductive material of the second levels comprising:
a conductive core in the distal and proximal regions; and
a liner of seed material surrounding at least a portion of the conductive core in at least one of the distal and proximal regions;
wherein the liner of seed material exists in both of the distal and proximal regions, the liner in the distal regions comprising a composition different from a composition of the liner in the proximal regions.

27. An assembly, comprising:
a stack of alternating first and second levels; the first levels comprising insulative material, and the second levels comprising conductive material;
channel structures extending through the stack;
the second levels comprising distal regions adjacent the channel structures and proximal regions spaced from the channel structures; and
the conductive material of the second levels comprising a liner of seed material existing in both of the distal and proximal regions, the liner in the distal regions comprising a composition different from a composition of the liner in the proximal regions.

28. The assembly of claim 27 wherein the composition in one of the distal and proximal regions comprises a dopant.

29. The assembly of claim 27 wherein the difference in the compositions between the distal and proximal regions is the difference in a concentration of a dopant.

30. The assembly of claim 27 wherein the difference in the compositions between the distal and proximal regions is the difference in a concentration of nitrogen.

31. The assembly of claim 27 wherein the difference in the compositions between the distal and proximal regions is the difference in metals.

* * * * *